(12) United States Patent
Yamazaki et al.

(10) Patent No.: US 7,714,975 B1
(45) Date of Patent: May 11, 2010

(54) LIQUID CRYSTAL DISPLAY DEVICE AND MANFACTURING METHOD THEREOF

(75) Inventors: Shunpei Yamazaki, Tokyo (JP); Yoshiharu Hirakata, Kanagawa (JP)

(73) Assignee: Semiconductor Energy Laboratory Co., Ltd, Atsugi-shi, Kanagawa-ken (JP)

( * ) Notice: Subject to any disclaimer, the term of this patent is extended or adjusted under 35 U.S.C. 154(b) by 0 days.

(21) Appl. No.: 09/566,742

(22) Filed: May 9, 2000

(30) Foreign Application Priority Data

Mar. 17, 2000 (JP) .............................. 2000-075467

(51) Int. Cl.
*G02F 1/1339* (2006.01)
(52) U.S. Cl. ........................... 349/155; 349/156; 349/43
(58) Field of Classification Search ................. 349/156, 349/155, 130, 43, 88, 86, 191, 94, 123, 132, 349/129, 157, 152, 38, 47, 178
See application file for complete search history.

(56) References Cited

U.S. PATENT DOCUMENTS

| | | | |
|---|---|---|---|
| 3,967,981 A | 7/1976 | Yamazaki | |
| 4,624,737 A | 11/1986 | Shimbo | |
| 4,730,903 A | 3/1988 | Yamazaki et al. | |
| 4,914,503 A | 4/1990 | Shirato et al. | |
| 4,960,719 A | 10/1990 | Tanaka et al. | |
| 5,028,551 A | 7/1991 | Dohjo et al. | |
| 5,084,961 A | 2/1992 | Yoshikawa | |
| 5,151,806 A | 9/1992 | Kawamoto et al. | |
| 5,231,039 A | 7/1993 | Sakono et al. | |
| 5,261,156 A | 11/1993 | Mase et al. | |
| 5,346,833 A | 9/1994 | Wu | |
| 5,362,660 A | 11/1994 | Kwasnick et al. | |
| 5,428,250 A | 6/1995 | Ikeda et al. | |
| 5,466,617 A | 11/1995 | Shannon | |

(Continued)

FOREIGN PATENT DOCUMENTS

EP          0 629 003          12/1994

(Continued)

OTHER PUBLICATIONS

Specification, Claims, Abstract and Drawings of U.S. Appl. No. 10/144,067 entitled *Semiconductor Device and Manufacturing Method Thereof* filed May 14, 2002.

(Continued)

*Primary Examiner*—Thoi V Duong
(74) *Attorney, Agent, or Firm*—Eric J. Robinson; Robinson Intellectual Property Law Office, P.C.

(57) ABSTRACT

An electro-optical device typified by an active matrix type liquid crystal display device, is manufactured by cutting a rubbing process, and in addition, a reduction in the manufacturing cost and an improvement in the yield are realized by reducing the number of process steps to manufacture a TFT.

By forming a pixel TFT portion having a reverse stagger type n-channel TFT, and a storage capacitor, by performing three photolithography steps using three photomasks, and in addition, by having a uniform cell gap by forming wall-like spacers by performing one photolithography step, without performing a rubbing process, a multi-domain perpendicular orientation type liquid crystal display device having a wide viewing angle display, and in which a switching direction of the liquid crystal molecules is controlled, can be realized.

66 Claims, 21 Drawing Sheets

U.S. PATENT DOCUMENTS

| | | |
|---|---|---|
| 5,478,766 A * | 12/1995 | Park et al. .................. 437/40 |
| 5,491,352 A | 2/1996 | Tsuji |
| 5,532,180 A | 7/1996 | den Boer et al. |
| 5,539,219 A | 7/1996 | den Boer et al. |
| 5,561,074 A | 10/1996 | Koide et al. |
| 5,561,440 A | 10/1996 | Kitajima et al. |
| 5,583,675 A * | 12/1996 | Yamada et al. ............. 349/84 |
| 5,622,814 A | 4/1997 | Miyata et al. |
| 5,644,147 A | 7/1997 | Yamazaki et al. |
| 5,648,662 A | 7/1997 | Zhang et al. |
| 5,668,379 A | 9/1997 | Ono et al. |
| 5,668,651 A * | 9/1997 | Yamada et al. ............ 349/156 |
| 5,684,318 A | 11/1997 | Ayres et al. |
| 5,706,064 A | 1/1998 | Fukunaga et al. |
| 5,710,612 A | 1/1998 | Mase |
| 5,729,312 A * | 3/1998 | Yamagishi et al. ............ 349/86 |
| 5,734,177 A | 3/1998 | Sakamoto |
| 5,739,549 A | 4/1998 | Takemura et al. |
| 5,739,880 A | 4/1998 | Suzuki et al. |
| 5,739,882 A * | 4/1998 | Shimizu et al. ............ 349/123 |
| 5,739,887 A | 4/1998 | Ueda et al. |
| 5,744,820 A | 4/1998 | Matsushima et al. |
| 5,757,453 A | 5/1998 | Shin et al. |
| 5,757,456 A | 5/1998 | Yamazaki et al. |
| 5,760,854 A | 6/1998 | Ono et al. |
| 5,766,977 A | 6/1998 | Yamazaki |
| 5,780,872 A | 7/1998 | Misawa et al. |
| 5,793,072 A | 8/1998 | Kuo |
| 5,798,812 A * | 8/1998 | Nishiki et al. ............... 349/152 |
| 5,804,501 A | 9/1998 | Kim |
| 5,811,318 A | 9/1998 | Kweon |
| 5,811,328 A | 9/1998 | Zhang et al. |
| 5,811,835 A | 9/1998 | Seiki et al. |
| 5,811,846 A | 9/1998 | Miura et al. |
| 5,818,070 A | 10/1998 | Yamazaki et al. |
| 5,821,138 A | 10/1998 | Yamazaki et al. |
| 5,821,622 A | 10/1998 | Tsuji et al. |
| 5,825,449 A | 10/1998 | Shin |
| 5,828,433 A | 10/1998 | Shin |
| 5,830,785 A | 11/1998 | Sanson et al. |
| 5,834,327 A | 11/1998 | Yamazaki et al. |
| 5,838,400 A | 11/1998 | Ueda et al. |
| 5,844,643 A * | 12/1998 | Onishi et al. .................. 349/93 |
| 5,847,687 A | 12/1998 | Hirakata et al. |
| 5,849,601 A | 12/1998 | Yamazaki |
| 5,852,487 A | 12/1998 | Fujimori et al. |
| 5,867,233 A | 2/1999 | Tanaka |
| 5,872,611 A | 2/1999 | Hirata et al. |
| 5,874,326 A | 2/1999 | Lyu |
| 5,880,794 A | 3/1999 | Hwang |
| 5,888,855 A | 3/1999 | Nagahisa et al. |
| 5,889,291 A | 3/1999 | Koyama et al. |
| 5,892,562 A | 4/1999 | Yamazaki et al. |
| 5,899,547 A | 5/1999 | Yamazaki et al. |
| 5,903,326 A | 5/1999 | Lee et al. |
| 5,907,380 A * | 5/1999 | Lien ........................... 349/141 |
| 5,917,564 A | 6/1999 | Kim et al. |
| 5,917,567 A | 6/1999 | Oh et al. |
| 5,940,154 A | 8/1999 | Ukita et al. |
| 5,942,767 A | 8/1999 | Na et al. |
| 5,943,559 A | 8/1999 | Maeda |
| 5,953,093 A | 9/1999 | Hirata et al. |
| 5,959,599 A | 9/1999 | Hirakata |
| 5,966,189 A | 10/1999 | Matsuo |
| 5,968,850 A | 10/1999 | Jeong et al. |
| 5,977,562 A | 11/1999 | Hirakata et al. |
| 5,986,724 A | 11/1999 | Akiyama et al. |
| 5,990,998 A | 11/1999 | Park et al. |
| 5,994,721 A | 11/1999 | Zhong et al. |
| 5,995,190 A | 11/1999 | Nagae et al. |
| 5,998,229 A | 12/1999 | Lyu et al. |
| 5,998,230 A | 12/1999 | Gee-Sung et al. |
| 6,008,065 A | 12/1999 | Lee et al. |
| 6,008,869 A | 12/1999 | Oana et al. |
| 6,020,598 A | 2/2000 | Yamazaki |
| 6,025,216 A | 2/2000 | Ha |
| 6,025,891 A | 2/2000 | Kim |
| 6,025,892 A | 2/2000 | Kawai et al. |
| 6,037,017 A | 3/2000 | Kashiro |
| 6,038,003 A | 3/2000 | Kim |
| 6,054,975 A | 4/2000 | Kurokawa et al. |
| 6,055,028 A | 4/2000 | Nishi et al. |
| 6,061,112 A | 5/2000 | Ukita et al. |
| 6,064,358 A | 5/2000 | Kitajima et al. |
| 6,064,456 A | 5/2000 | Taniguchi et al. |
| 6,067,141 A | 5/2000 | Yamada et al. |
| 6,072,556 A | 6/2000 | Hirakata et al. |
| 6,072,557 A * | 6/2000 | Kishimoto .................. 349/156 |
| 6,075,257 A * | 6/2000 | Song ........................... 257/59 |
| 6,097,458 A | 8/2000 | Tsuda et al. |
| 6,097,459 A | 8/2000 | Shimada et al. |
| 6,097,465 A | 8/2000 | Hiroki et al. |
| 6,114,184 A | 9/2000 | Matsumoto et al. |
| 6,118,502 A | 9/2000 | Yamazaki et al. |
| 6,124,155 A | 9/2000 | Zhang et al. |
| 6,124,604 A | 9/2000 | Koyama et al. |
| 6,124,606 A | 9/2000 | den Boer et al. |
| 6,130,443 A | 10/2000 | Hong et al. |
| 6,130,729 A | 10/2000 | Oh et al. |
| 6,133,977 A | 10/2000 | Lee et al. |
| 6,140,158 A | 10/2000 | Rhee et al. |
| 6,141,077 A | 10/2000 | Hirata et al. |
| 6,153,893 A | 11/2000 | Inoue et al. |
| 6,160,600 A | 12/2000 | Yamazaki et al. |
| 6,166,396 A | 12/2000 | Yamazaki |
| 6,166,399 A | 12/2000 | Zhang et al. |
| 6,172,728 B1 | 1/2001 | Hiraishi |
| 6,177,968 B1 | 1/2001 | Okada et al. |
| 6,184,946 B1 | 2/2001 | Ando et al. |
| 6,188,452 B1 | 2/2001 | Kim et al. |
| 6,190,933 B1 | 2/2001 | Shimabukuro et al. |
| 6,197,625 B1 | 3/2001 | Choi |
| 6,198,133 B1 | 3/2001 | Yamazaki et al. |
| 6,208,390 B1 | 3/2001 | Ejiri et al. |
| 6,208,395 B1 | 3/2001 | Kanoh et al. |
| 6,215,541 B1 | 4/2001 | Song et al. |
| 6,218,219 B1 | 4/2001 | Yamazaki et al. |
| 6,218,221 B1 | 4/2001 | Sah |
| 6,222,603 B1 | 4/2001 | Sakai et al. |
| 6,235,561 B1 | 5/2001 | Seiki et al. |
| 6,239,854 B1 | 5/2001 | Hirakata et al. |
| 6,243,064 B1 | 6/2001 | Hirakata |
| 6,255,668 B1 | 7/2001 | Kang et al. |
| 6,265,889 B1 | 7/2001 | Tomita et al. |
| 6,266,117 B1 | 7/2001 | Yanagawa et al. |
| 6,266,121 B1 * | 7/2001 | Shigeta et al. ............... 349/156 |
| 6,266,122 B1 * | 7/2001 | Kishimoto et al. .......... 349/156 |
| 6,268,617 B1 | 7/2001 | Hirakata et al. |
| 6,271,903 B1 | 8/2001 | Shin et al. |
| 6,287,899 B1 | 9/2001 | Park et al. |
| 6,297,519 B1 | 10/2001 | Fujikawa et al. |
| 6,304,243 B1 | 10/2001 | Kondo et al. |
| 6,317,187 B1 * | 11/2001 | Nakajima et al. ........... 349/155 |
| 6,323,051 B1 | 11/2001 | Shimada |
| 6,330,049 B1 | 12/2001 | Kume et al. |
| 6,331,845 B1 | 12/2001 | Kitajima et al. |
| 6,331,881 B1 * | 12/2001 | Hatano et al. ................. 349/86 |
| 6,335,213 B1 | 1/2002 | Zhang et al. |
| 6,335,778 B1 | 1/2002 | Kubota et al. |
| 6,339,462 B1 * | 1/2002 | Kishimoto et al. .......... 349/156 |
| 6,341,002 B1 | 1/2002 | Shimizu et al. |
| 6,342,939 B1 | 1/2002 | Hirata et al. |
| 6,344,888 B2 | 2/2002 | Yasukawa |
| 6,359,672 B2 | 3/2002 | Gu et al. |

| | | |
|---|---|---|
| 6,362,866 B1 | 3/2002 | Yamazaki et al. |
| 6,365,933 B1 | 4/2002 | Yamazaki et al. |
| 6,368,485 B1 | 4/2002 | Ue et al. |
| 6,384,818 B1 | 5/2002 | Yamazaki et al. |
| 6,387,737 B1 | 5/2002 | Yamazaki et al. |
| 6,407,431 B2 | 6/2002 | Yamazaki et al. |
| 6,411,358 B2 | 6/2002 | Song et al. |
| 6,429,057 B1 | 8/2002 | Hong et al. |
| 6,433,842 B1 | 8/2002 | Kaneko et al. |
| 6,437,844 B1 * | 8/2002 | Hattori et al. ............... 349/129 |
| 6,441,399 B1 | 8/2002 | Koyama et al. |
| 6,456,269 B2 | 9/2002 | Hirakata |
| 6,462,802 B1 | 10/2002 | Nishimura et al. |
| 6,465,268 B2 | 10/2002 | Hirakata et al. |
| 6,466,289 B1 | 10/2002 | Lee et al. |
| 6,493,050 B1 * | 12/2002 | Lien et al. .................. 349/106 |
| 6,498,634 B1 | 12/2002 | Yamazaki et al. |
| 6,519,018 B1 * | 2/2003 | Samant et al. ............. 349/130 |
| 6,528,357 B2 | 3/2003 | Dojo et al. |
| 6,529,256 B1 | 3/2003 | Seo |
| 6,531,392 B2 | 3/2003 | Song et al. |
| 6,573,564 B2 | 6/2003 | Yamazaki et al. |
| 6,583,065 B1 | 6/2003 | Williams et al. |
| 6,587,162 B1 | 7/2003 | Kaneko et al. |
| 6,599,791 B1 | 7/2003 | Koyama et al. |
| 6,611,309 B2 | 8/2003 | Park et al. |
| 6,617,644 B1 | 9/2003 | Yamazaki et al. |
| 6,621,102 B2 | 9/2003 | Hirakata et al. |
| 6,624,864 B1 * | 9/2003 | Kubo et al. ................. 349/139 |
| 6,630,977 B1 | 10/2003 | Yamazaki et al. |
| 6,642,074 B2 | 11/2003 | Hong et al. |
| 6,661,488 B1 | 12/2003 | Takeda et al. |
| 6,671,025 B1 | 12/2003 | Ikeda et al. |
| 6,697,129 B1 | 2/2004 | Nishi et al. |
| 6,709,901 B1 | 3/2004 | Yamazaki et al. |
| 6,743,650 B2 | 6/2004 | Hirakata et al. |
| 6,747,288 B2 | 6/2004 | Yamazaki et al. |
| 6,756,258 B2 | 6/2004 | Zhang et al. |
| 6,762,082 B2 | 7/2004 | Yamazaki et al. |
| 6,762,813 B1 | 7/2004 | Zhang et al. |
| 6,771,342 B1 | 8/2004 | Hirakata et al. |
| 6,774,974 B1 * | 8/2004 | Matsuyama ................. 349/155 |
| 6,787,809 B2 | 9/2004 | Hong et al. |
| 6,797,548 B2 | 9/2004 | Zhang et al. |
| 6,806,495 B1 | 10/2004 | Yamazaki et al. |
| 6,806,499 B2 | 10/2004 | Yamazaki et al. |
| 6,806,937 B2 | 10/2004 | Park et al. |
| 6,847,064 B2 | 1/2005 | Zhang et al. |
| 6,855,957 B1 | 2/2005 | Yamazaki et al. |
| 6,856,360 B1 | 2/2005 | Higuchi et al. |
| 6,856,372 B2 | 2/2005 | Song et al. |
| 6,861,670 B1 | 3/2005 | Ohtani et al. |
| 6,873,312 B2 | 3/2005 | Matsueda |
| 6,900,084 B1 | 5/2005 | Yamazaki |
| 6,911,962 B1 | 6/2005 | Hirakata et al. |
| 6,914,655 B2 | 7/2005 | Yamazaki et al. |
| 6,950,168 B2 | 9/2005 | Yamazaki et al. |
| 7,071,037 B2 | 7/2006 | Suzawa et al. |
| 7,078,255 B2 | 7/2006 | Hong et al. |
| 7,102,165 B2 | 9/2006 | Yamazaki |
| 7,102,718 B1 | 9/2006 | Yamazaki et al. |
| 7,145,173 B2 | 12/2006 | Koyama et al. |
| 7,166,862 B2 | 1/2007 | Koyama et al. |
| 7,202,497 B2 | 4/2007 | Ohtani et al. |
| 7,235,810 B1 | 6/2007 | Yamazaki et al. |
| 7,259,427 B2 | 8/2007 | Yamazaki et al. |
| 7,279,711 B1 | 10/2007 | Yamazaki et al. |
| 7,317,438 B2 | 1/2008 | Yamazaki et al. |
| 7,323,715 B2 | 1/2008 | Yamazaki |
| 7,403,238 B2 | 7/2008 | Higuchi et al. |
| 7,414,266 B2 | 8/2008 | Yamazaki et al. |
| 2001/0022677 A1 | 9/2001 | Hirakata et al. |
| 2001/0046016 A1 | 11/2001 | Park et al. |

| | | |
|---|---|---|
| 2002/0063253 A1 | 5/2002 | Hong et al. |
| 2002/0132396 A1 | 9/2002 | Yamazaki et al. |
| 2002/0145602 A1 | 10/2002 | Matsueda |
| 2002/0160555 A1 | 10/2002 | Hong et al. |
| 2002/0171085 A1 | 11/2002 | Suzawa et al. |
| 2003/0058210 A1 | 3/2003 | Yamazaki et al. |
| 2003/0133067 A1 | 7/2003 | Park et al. |
| 2004/0036073 A1 | 2/2004 | Hong et al. |
| 2004/0051142 A1 | 3/2004 | Yamazaki et al. |
| 2004/0125305 A1 | 7/2004 | Nishi et al. |
| 2004/0207789 A1 | 10/2004 | Hirakata et al. |
| 2004/0218112 A1 | 11/2004 | Hirakata et al. |
| 2004/0257511 A1 | 12/2004 | Song et al. |
| 2005/0007535 A1 | 1/2005 | Hirakata et al. |
| 2005/0017243 A1 | 1/2005 | Zhang et al. |
| 2005/0023528 A1 | 2/2005 | Yamazaki et al. |
| 2005/0023534 A1 | 2/2005 | Hong et al. |
| 2005/0059199 A1 | 3/2005 | Yamazaki et al. |
| 2005/0082536 A1 | 4/2005 | Park et al. |
| 2005/0098894 A1 | 5/2005 | Ohtani et al. |
| 2005/0134753 A1 | 6/2005 | Higuchi et al. |
| 2005/0205870 A1 | 9/2005 | Yamazaki |
| 2005/0221542 A1 | 10/2005 | Yamazaki et al. |
| 2006/0081931 A1 | 4/2006 | Yamazaki et al. |
| 2006/0163574 A1 | 7/2006 | Yamazaki et al. |
| 2006/0228821 A1 | 10/2006 | Hong et al. |
| 2007/0001171 A1 | 1/2007 | Yamazaki |
| 2007/0058121 A1 | 3/2007 | Yamazaki et al. |
| 2007/0146568 A1 | 6/2007 | Yamazaki et al. |
| 2008/0315208 A1 | 12/2008 | Yamazaki et al. |
| 2009/0026464 A1 | 1/2009 | Yamazaki et al. |
| 2009/0152551 A1 | 6/2009 | Yamazaki |

FOREIGN PATENT DOCUMENTS

| | | |
|---|---|---|
| EP | 0 678 907 | 10/1995 |
| EP | 1 001 467 | 5/2000 |
| EP | 1 006 589 | 6/2000 |
| EP | 1 041 622 | 10/2000 |
| JP | 01-210989 | 8/1989 |
| JP | 05-034717 | 2/1993 |
| JP | 05-119331 | 5/1993 |
| JP | 05-42558 | 6/1993 |
| JP | 05-175500 | 7/1993 |
| JP | 05-265020 | 10/1993 |
| JP | 05-323371 | 12/1993 |
| JP | 06-082754 | 3/1994 |
| JP | 06-148683 | 5/1994 |
| JP | 06-194615 | 7/1994 |
| JP | 06-331948 | 12/1994 |
| JP | 06-337405 | 12/1994 |
| JP | 07-014880 | 1/1995 |
| JP | 07-152024 | 6/1995 |
| JP | 07-159776 | 6/1995 |
| JP | 07-191348 | 7/1995 |
| JP | 07-306414 | 11/1995 |
| JP | 07-318975 | 12/1995 |
| JP | 08-087030 | 4/1996 |
| JP | 08-087033 | 4/1996 |
| JP | 08-095064 | 4/1996 |
| JP | 08-152609 | 6/1996 |
| JP | 09-005767 | 1/1997 |
| JP | 9-54318 | 2/1997 |
| JP | 09-074257 A | 3/1997 |
| JP | 09-080399 | 3/1997 |
| JP | 09-090397 | 4/1997 |
| JP | 09-152626 | 6/1997 |
| JP | 09-153618 | 6/1997 |
| JP | 09-203890 | 8/1997 |
| JP | 09-274444 | 10/1997 |
| JP | 10-048651 | 2/1998 |
| JP | 10-048663 | 2/1998 |
| JP | 10-123574 | 5/1998 |

| | | |
|---|---|---|
| JP | 10-161125 | 6/1998 |
| JP | 10-161135 | 6/1998 |
| JP | 10-228023 | 8/1998 |
| JP | 10-268317 | 10/1998 |
| JP | 10-293308 | 11/1998 |
| JP | 10-307288 | 11/1998 |
| JP | 09-015621 | 1/1999 |
| JP | 11-038450 | 2/1999 |
| JP | 11-103067 | 4/1999 |
| JP | 11-109372 * | 4/1999 |
| JP | 11-133455 | 5/1999 |
| JP | 11-160732 | 6/1999 |
| JP | 11-160734 | 6/1999 |
| JP | 11-202368 | 7/1999 |
| JP | 11-258596 | 9/1999 |
| JP | 11-258625 | 9/1999 |
| JP | 11-264998 A | 9/1999 |
| JP | 11-337978 | 12/1999 |
| JP | 2000-002892 | 1/2000 |
| JP | 2000-047216 | 2/2000 |
| JP | 2000-075302 | 3/2000 |
| JP | 2000-081623 | 3/2000 |
| JP | 2000-193984 | 7/2000 |
| JP | 2000-341242 | 12/2000 |
| JP | 2001-085698 | 3/2001 |
| KR | 1996-0000262 | 1/1996 |
| KR | 1997-024311 | 5/1997 |
| KR | 1998-072232 | 11/1998 |
| KR | 161466 | 1/1999 |
| KR | 1999-011210 | 2/1999 |
| KR | 1999-063319 | 7/1999 |
| KR | 1999-0063562 | 7/1999 |
| KR | 1999-074563 | 10/1999 |
| KR | 1999-075407 | 10/1999 |
| KR | 2000-033515 | 6/2000 |
| KR | 10-0510439 | 8/2005 |

OTHER PUBLICATIONS

Specification, claims, abstract, and drawings of U.S. Appl. No. 09/635,945, filed Aug. 10, 2000.

Wolf et al., "Silicon Processing for the VLSI Era", pp. 161-175, 335, 1986, Lattice Press vol. 1 Process Technology.

Office Action (Application No. JP 2006-325661) Dated Jan. 23, 2007.

Wolf et al., Silicon Processing for the VLSI Era, vol. 1, pp. 359-365, 1986, Lattice Press.

* cited by examiner

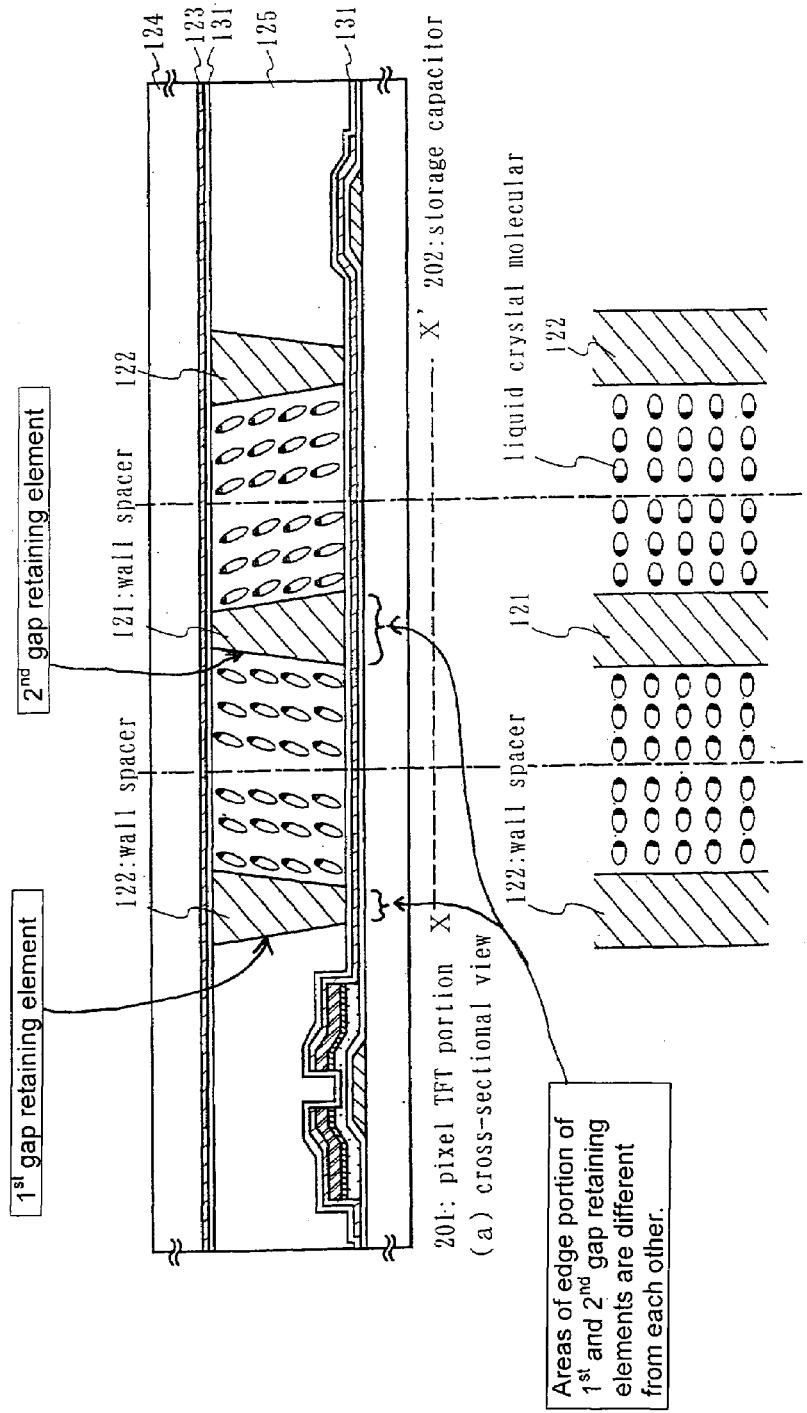
[FIG. 1]

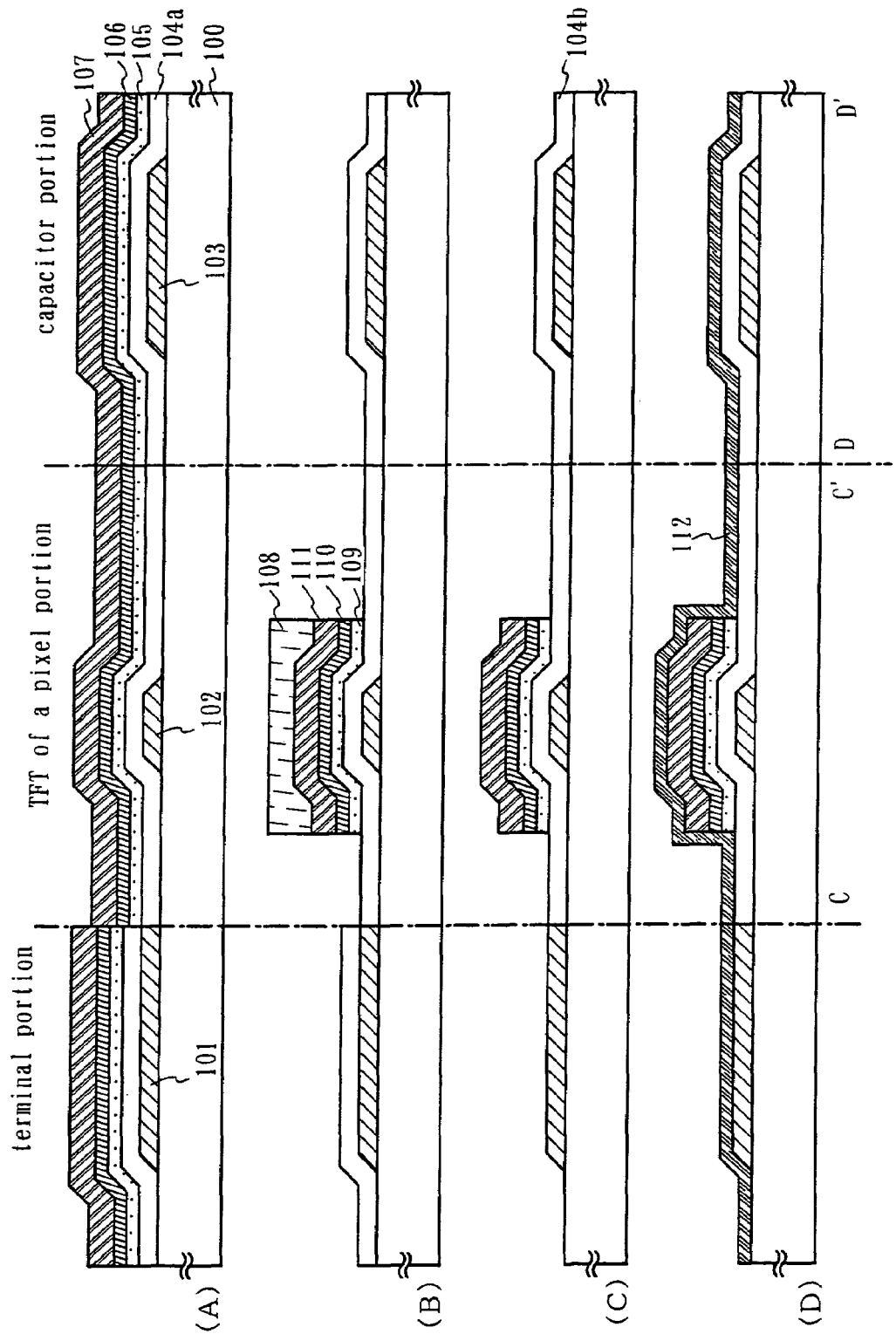
[FIG. 2]

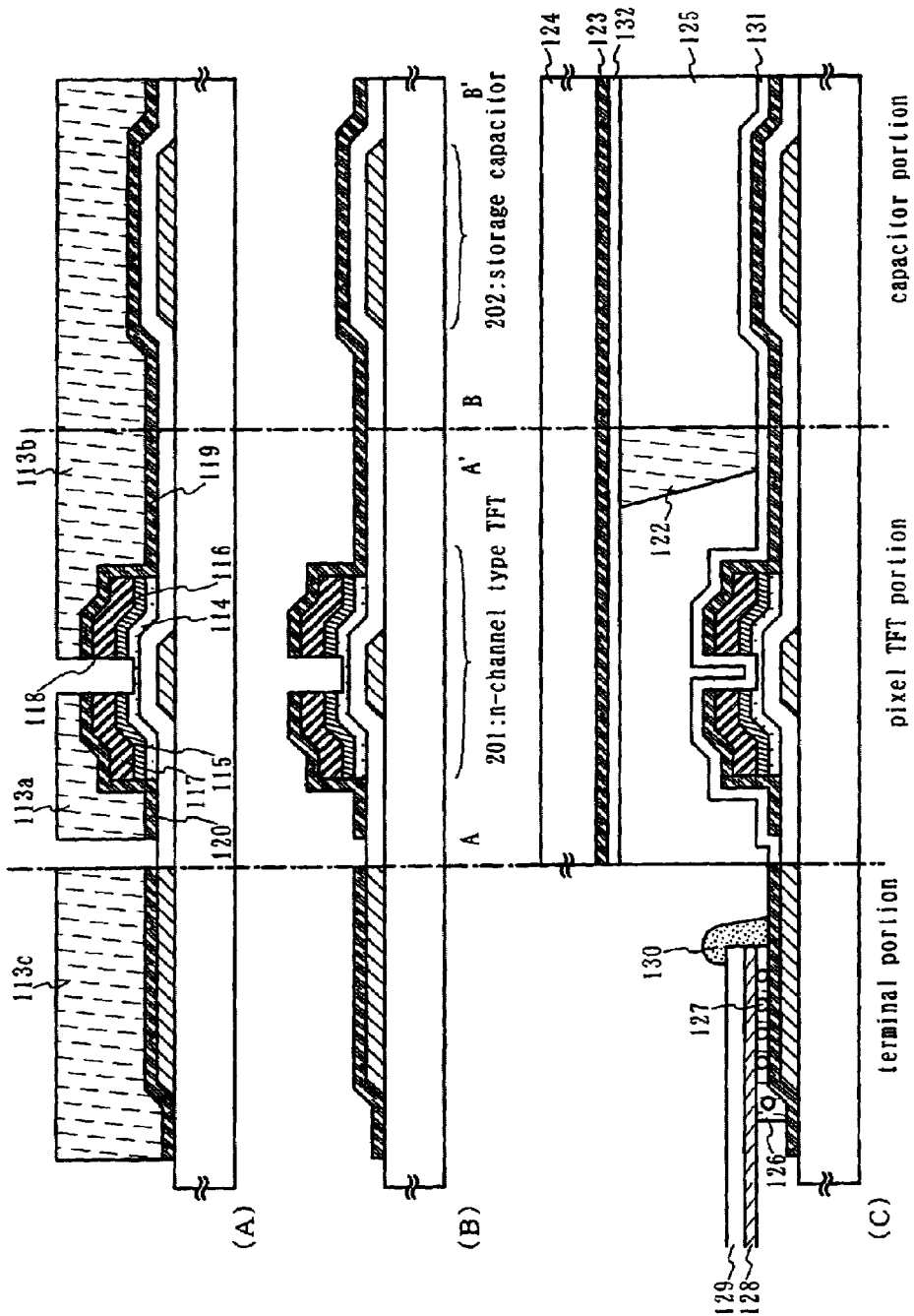
[FIG. 3]

[FIG. 4]
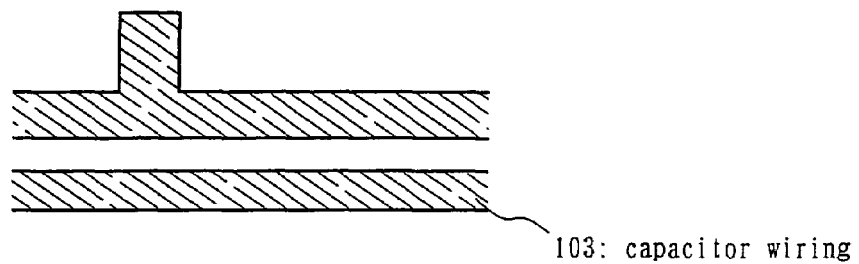
103: capacitor wiring
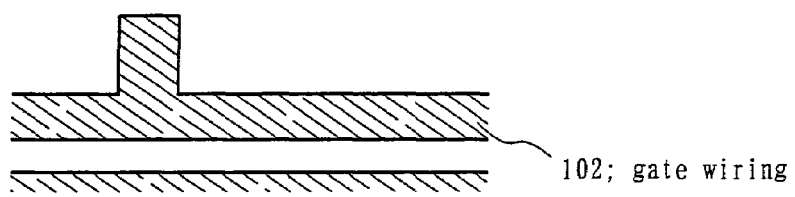
102: gate wiring

[FIG. 5]
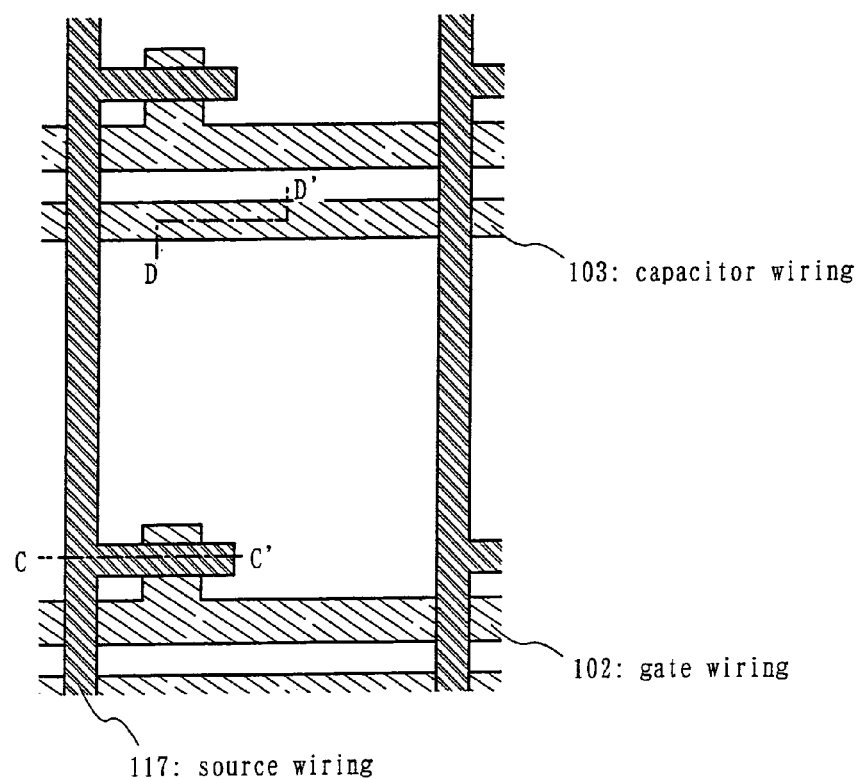

[FIG. 6]
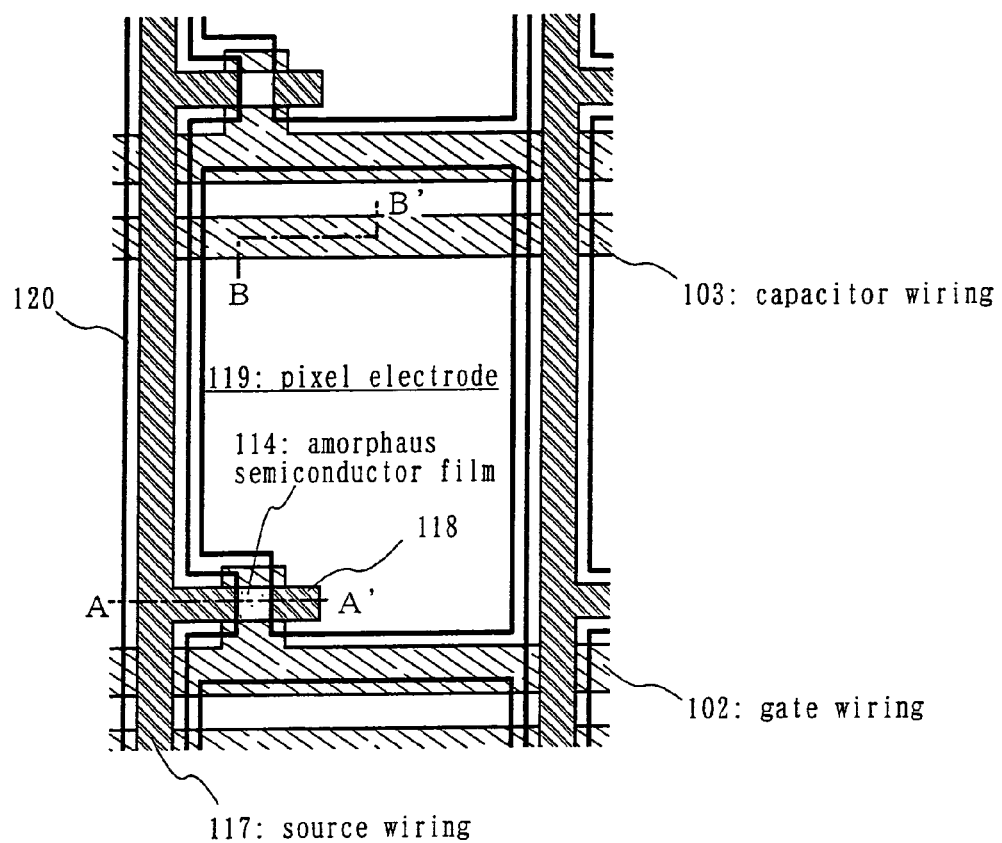

[FIG. 7]
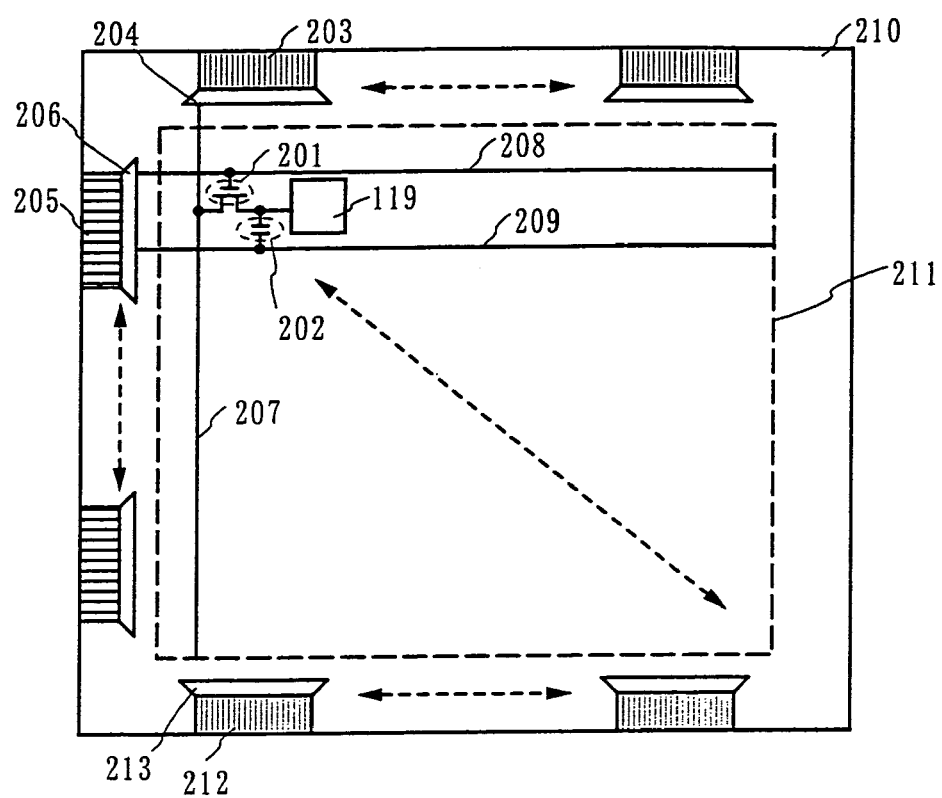

[FIG. 8]
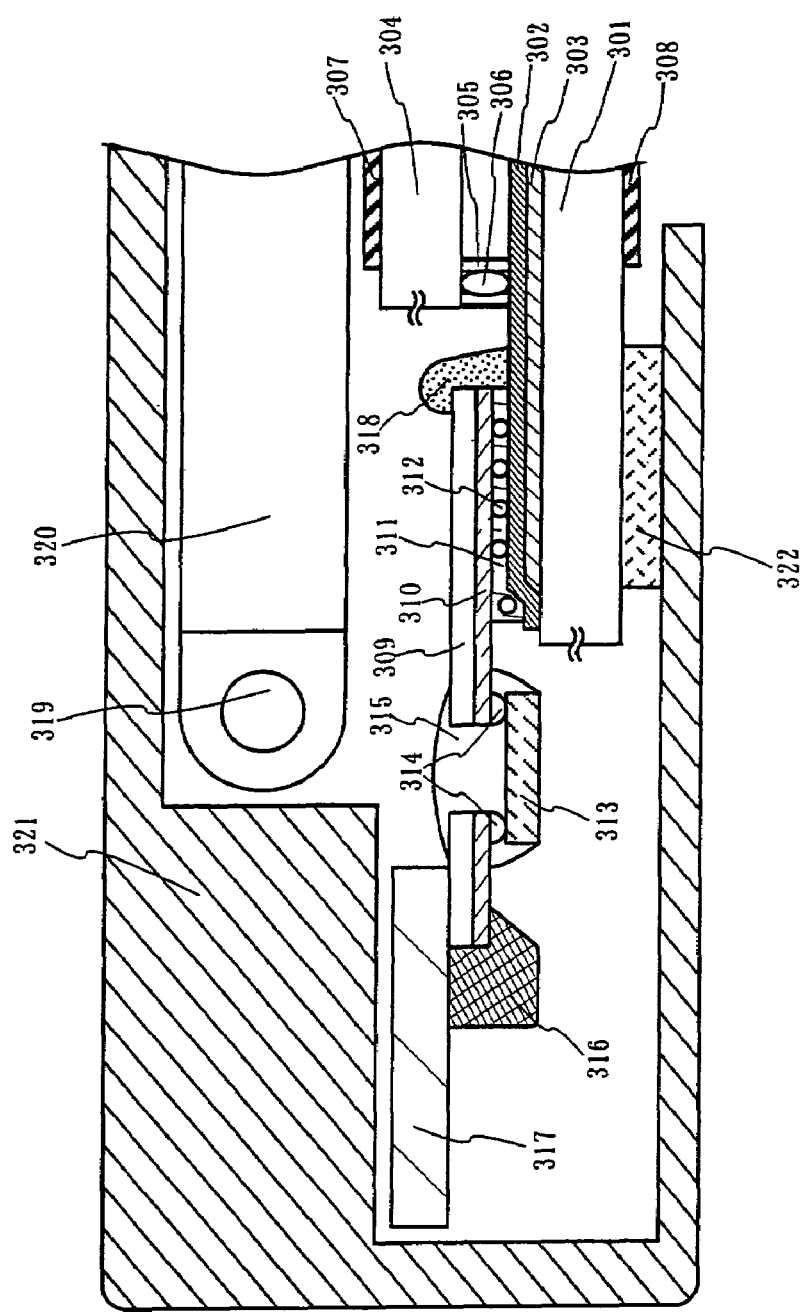

[FIG. 9]
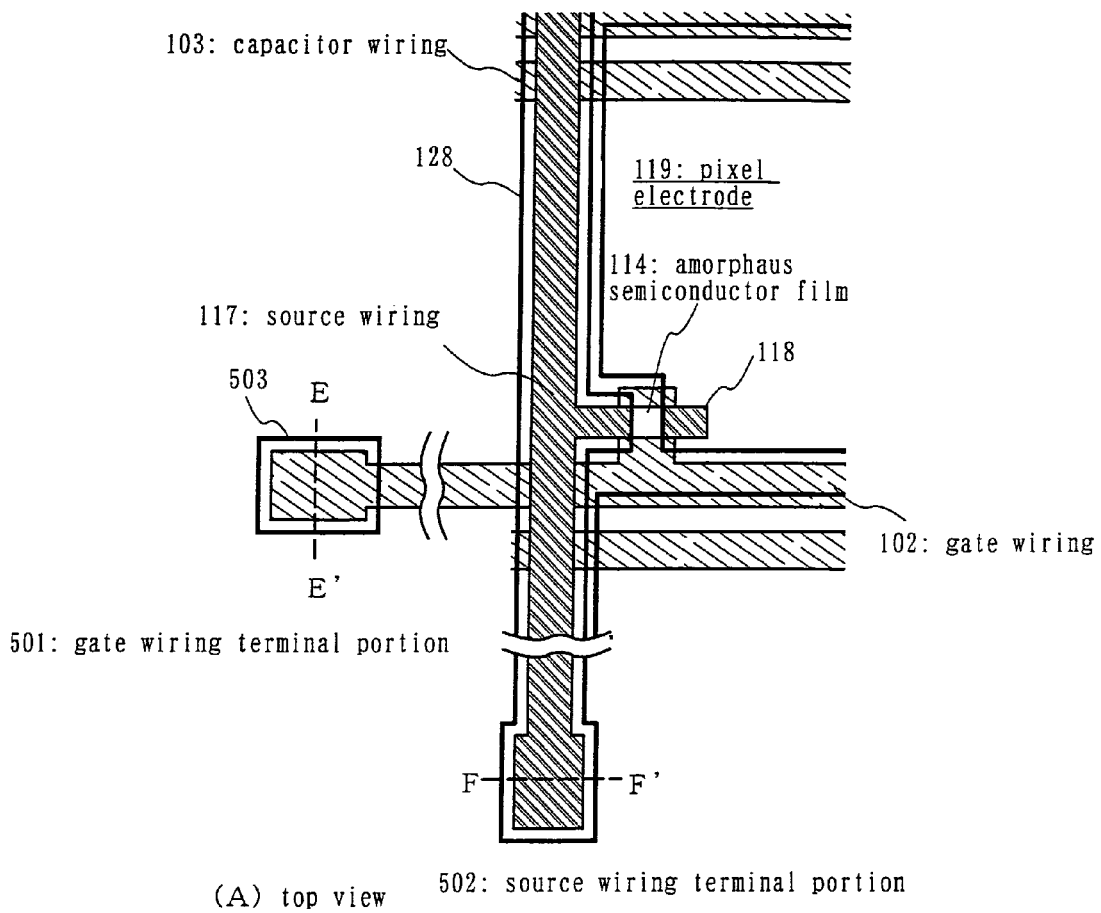
(A) top view
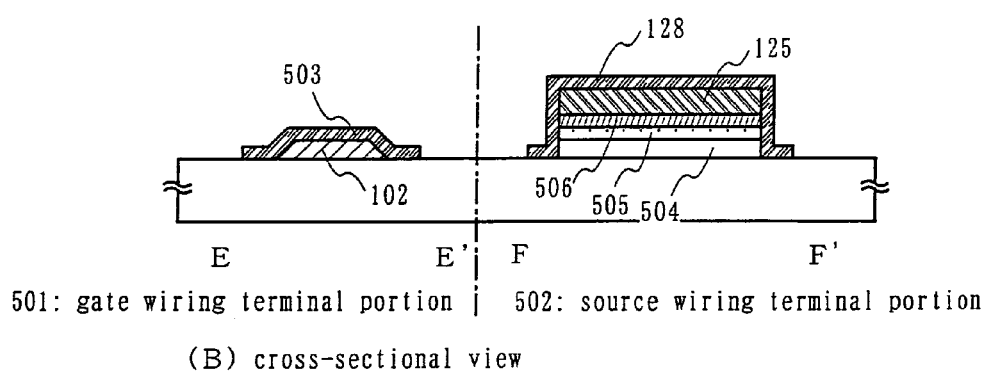
(B) cross-sectional view

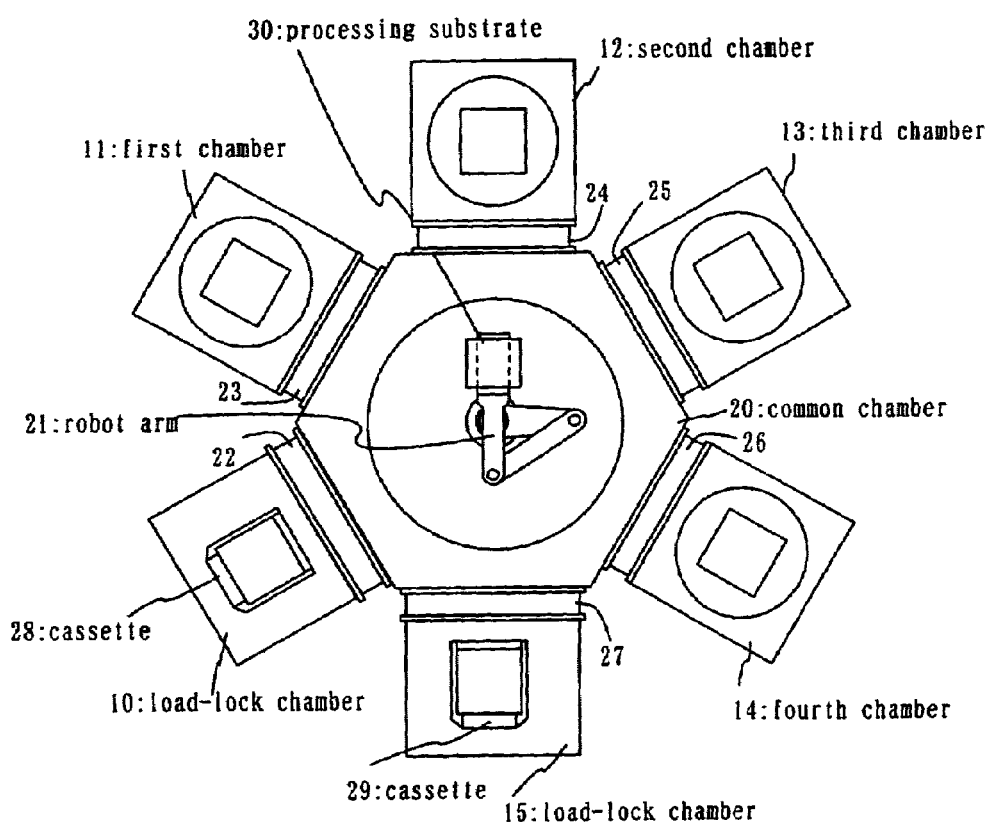
[FIG. 10]

[FIG. 11]
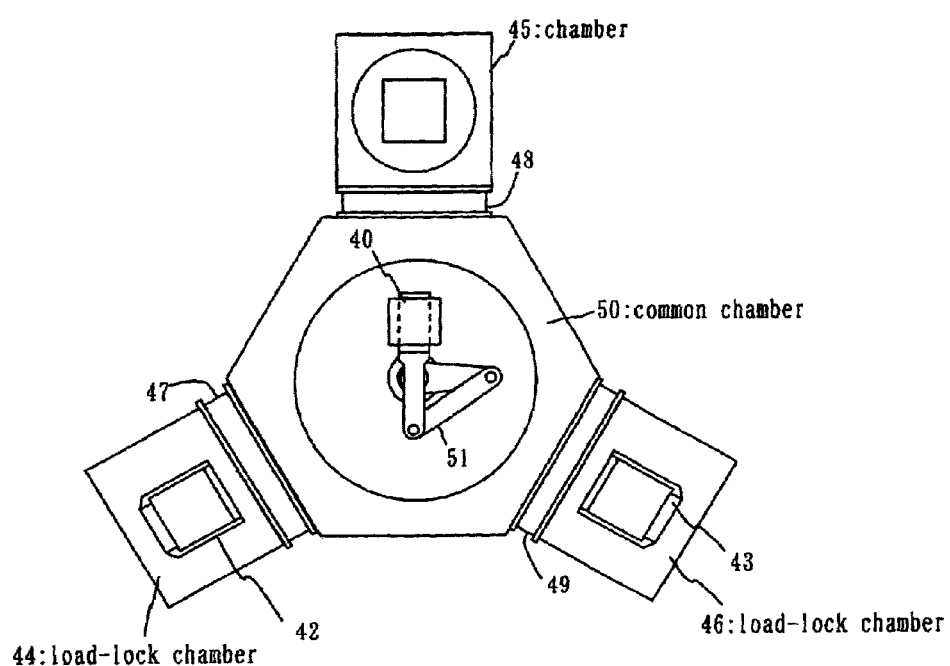

[FIG. 12]
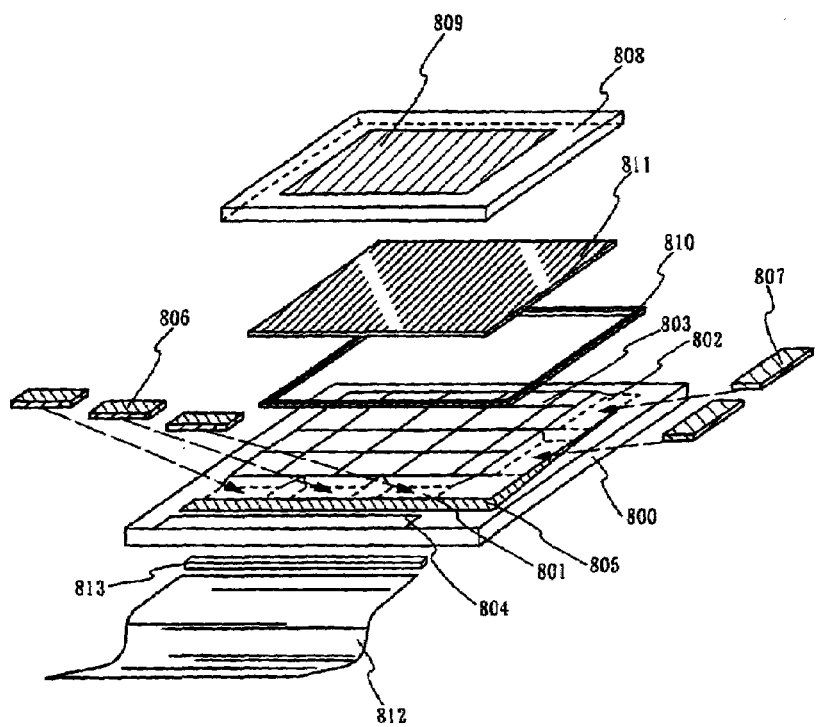
800:first substrate, 801:region for attaching a scanning line side IC chip,
802:region for attaching a data line side IC chip, 803:pixel region,
804:input-putput terminal, 805:connecting wiring, 806, 807:IC chip,
808:second substrate, 809:opposing electrode, 810:sealing material, 811:liquid crystal,
812:FPC, 813:reinforcing plate

[FIG. 13]
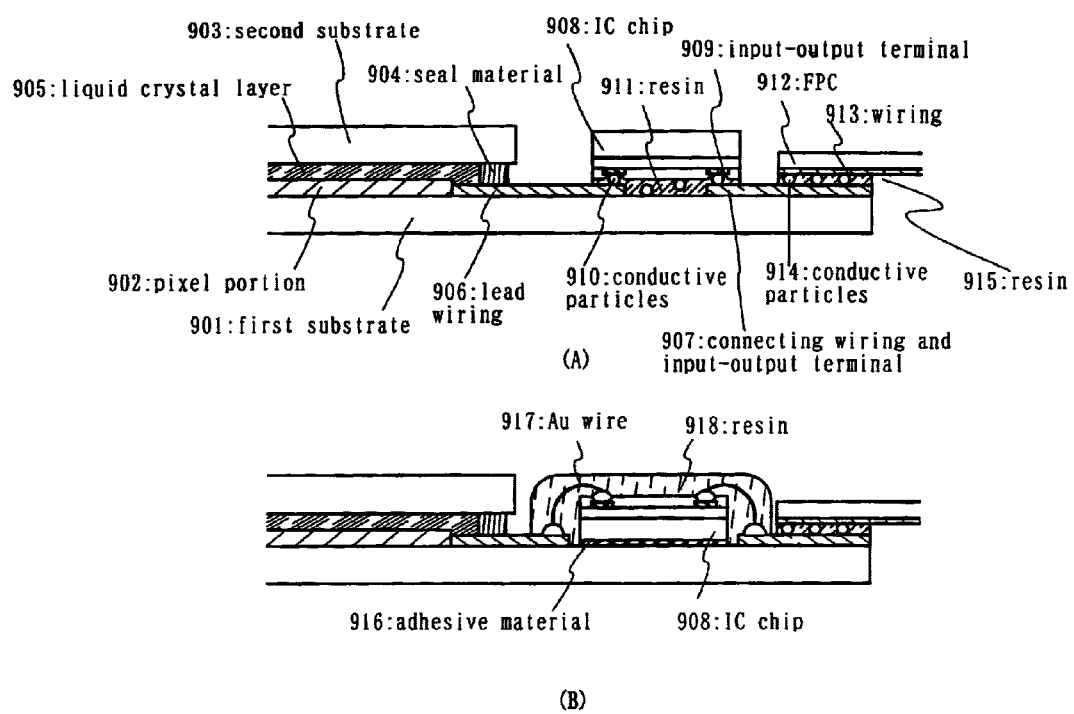

[FIG. 14]
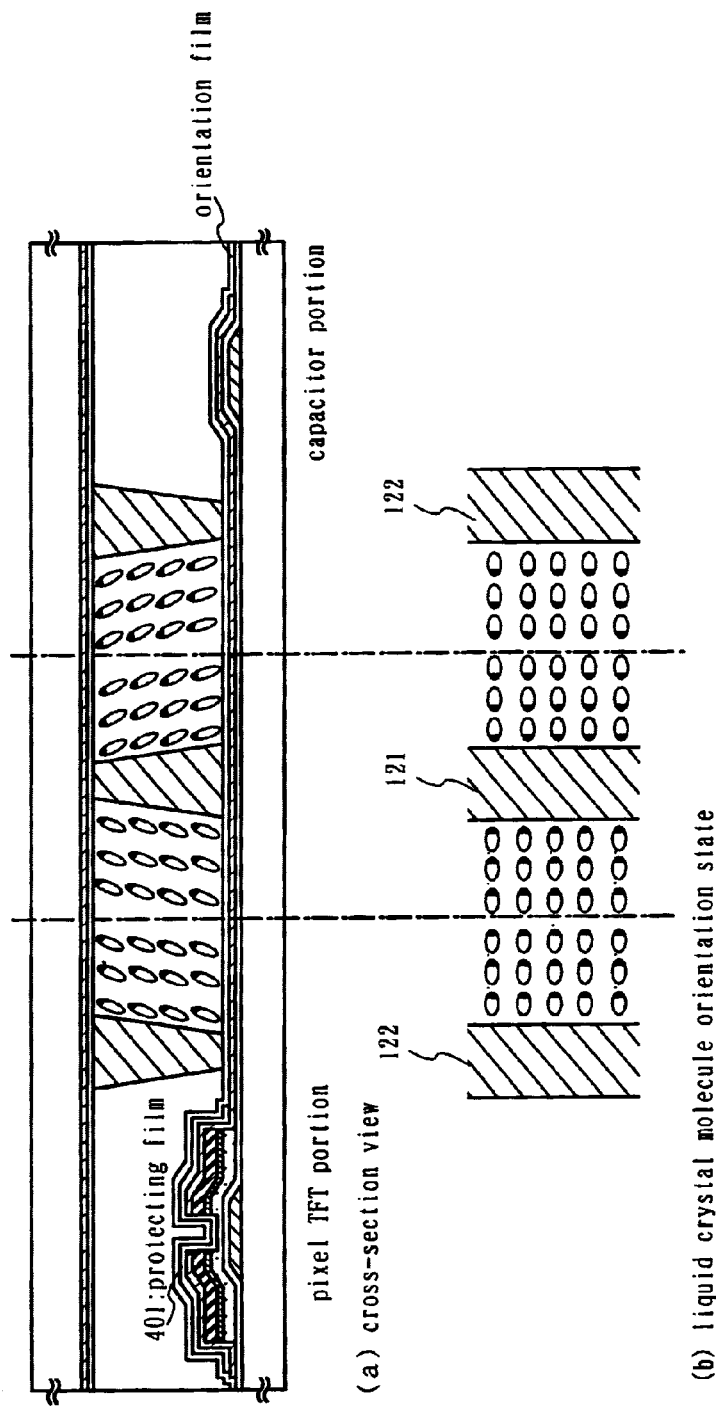

[FIG. 15]
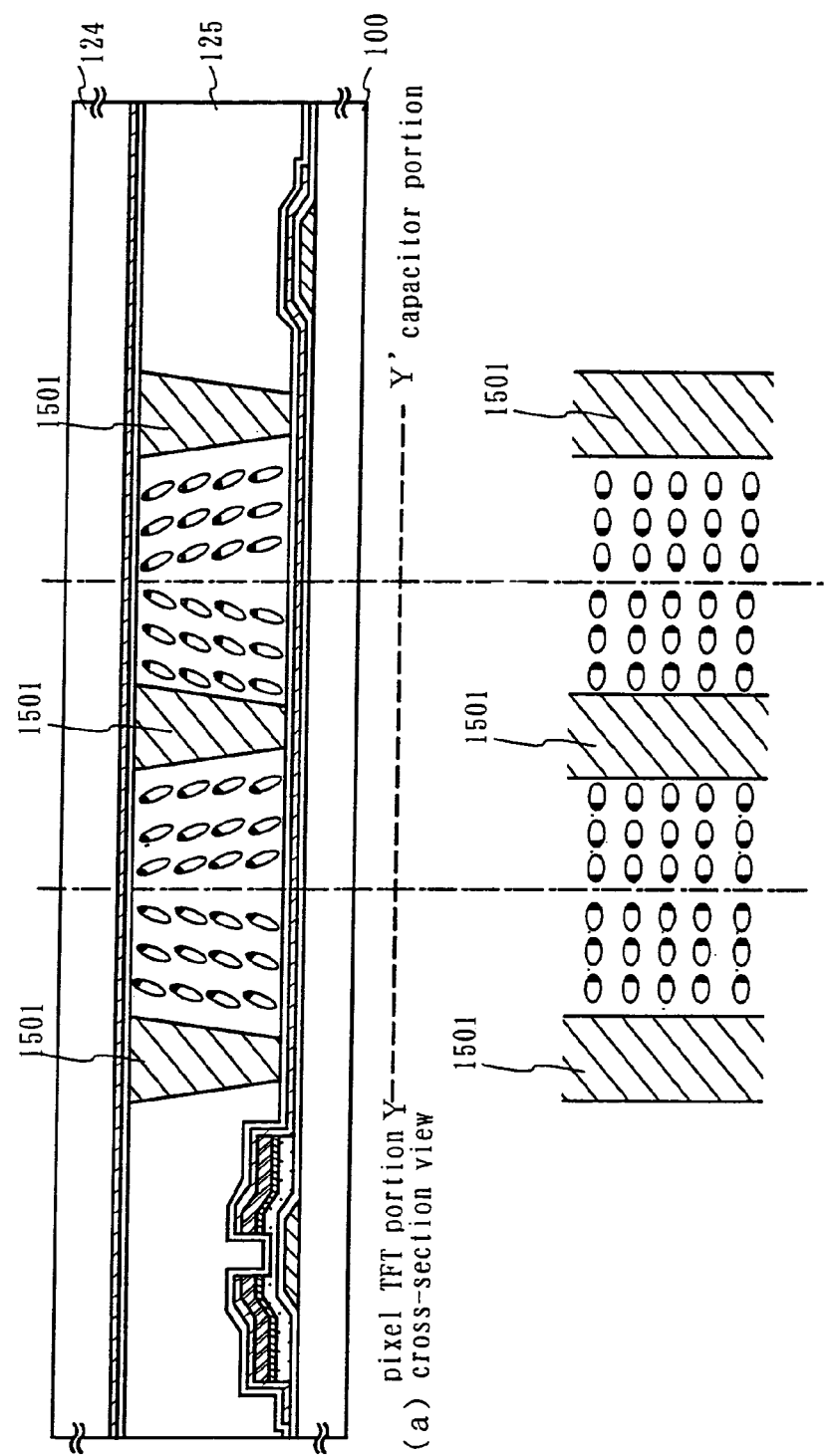

[FIG. 16]
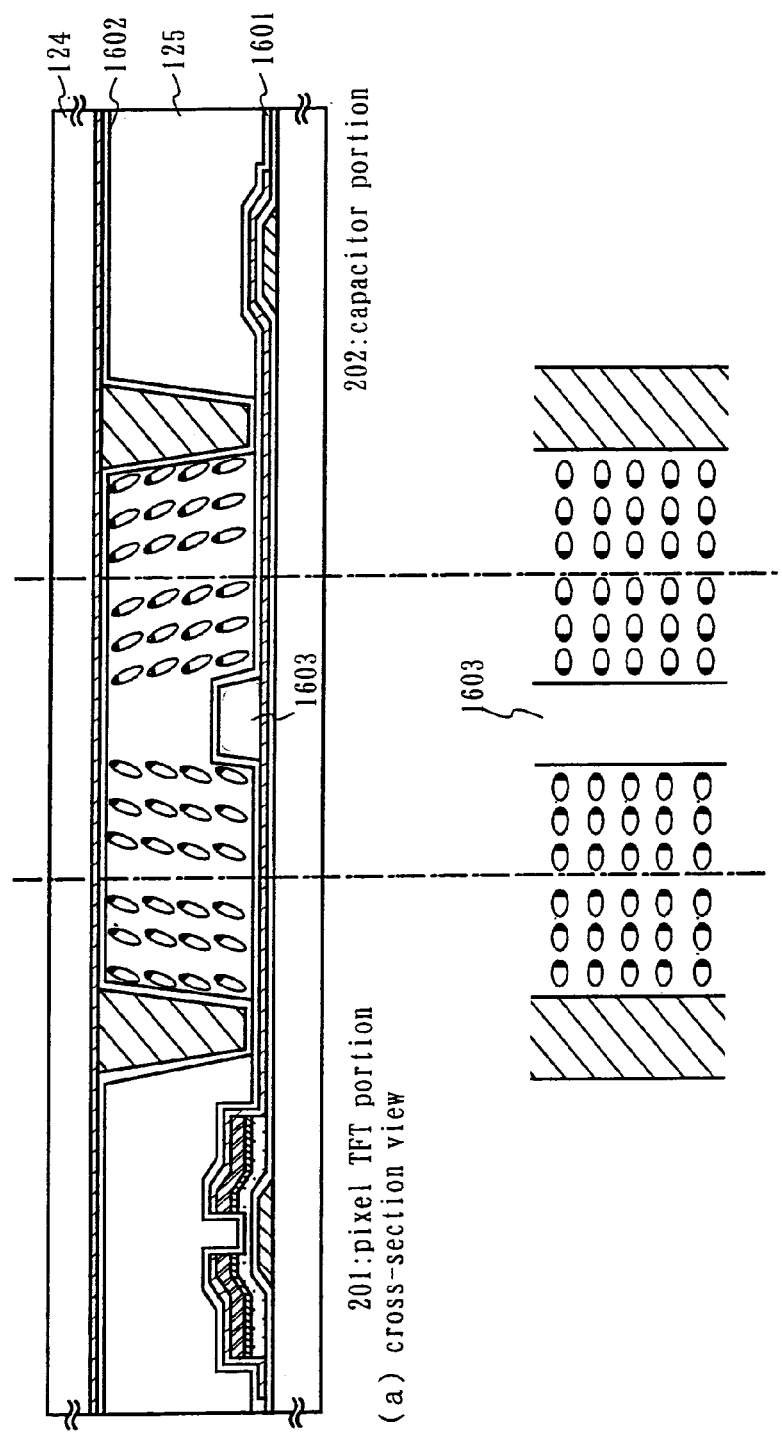

[FIG. 17]
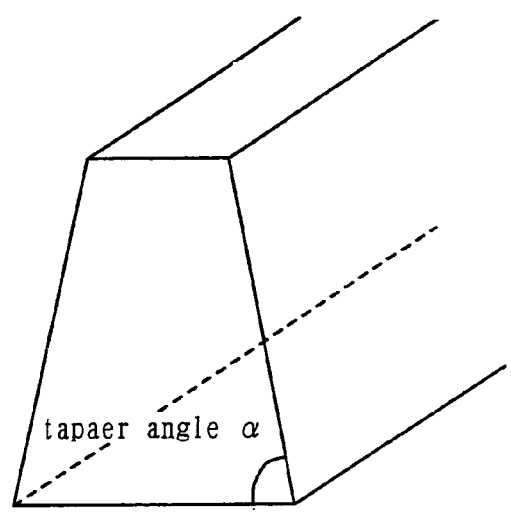
(a) diagram showing prespective view of wall-like spacer
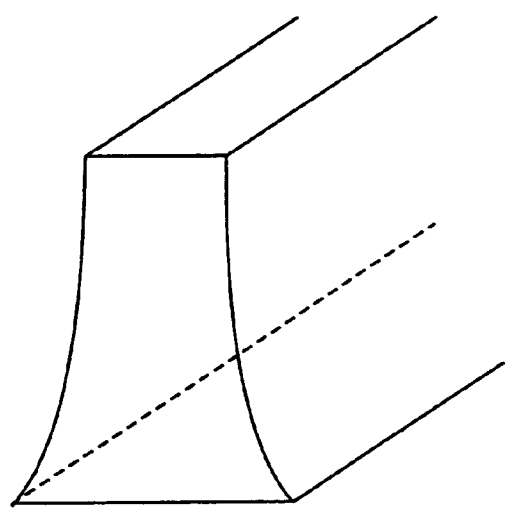
(b) shape of wall-like spacer

[FIG. 18]
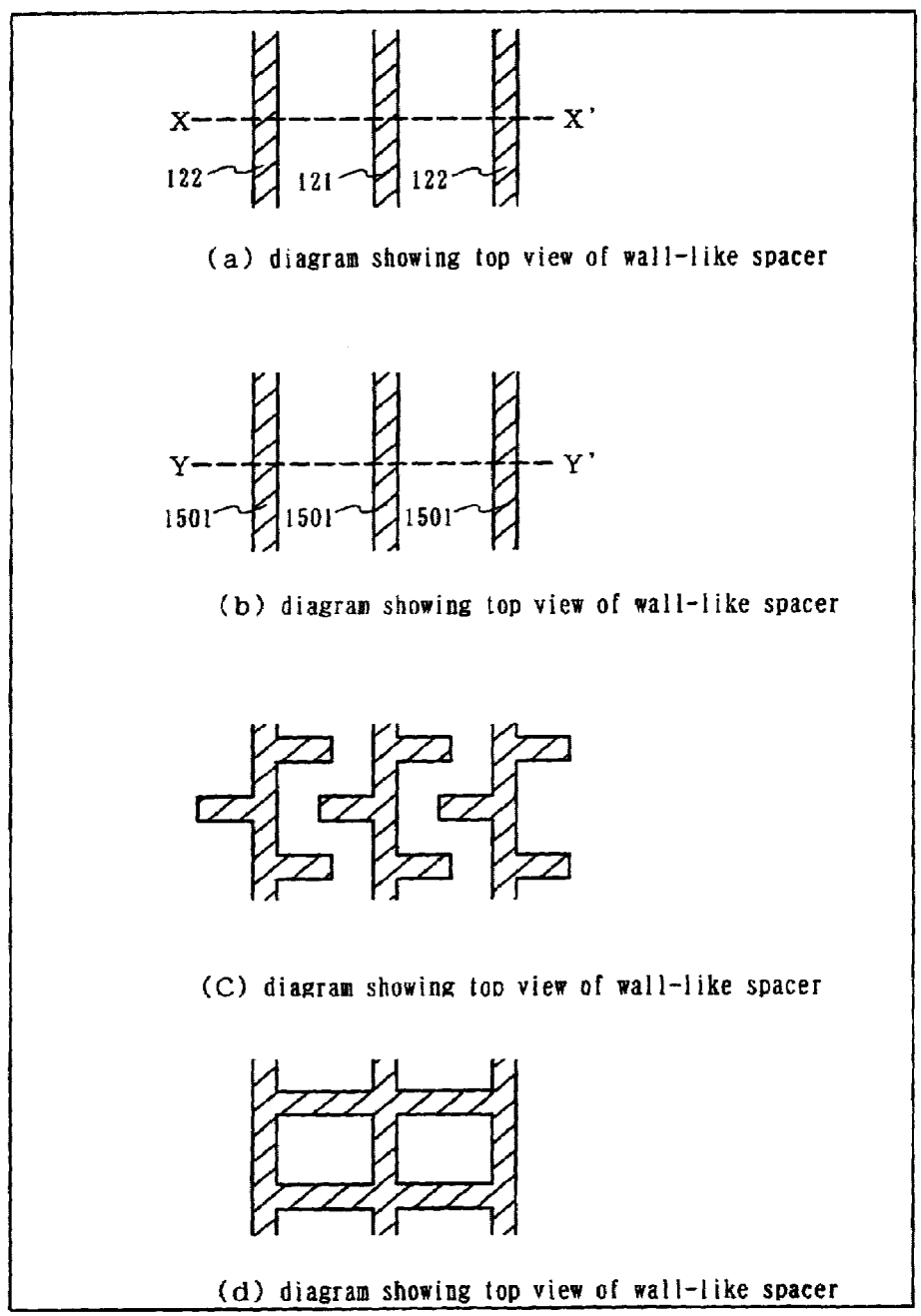

[FIG. 19]
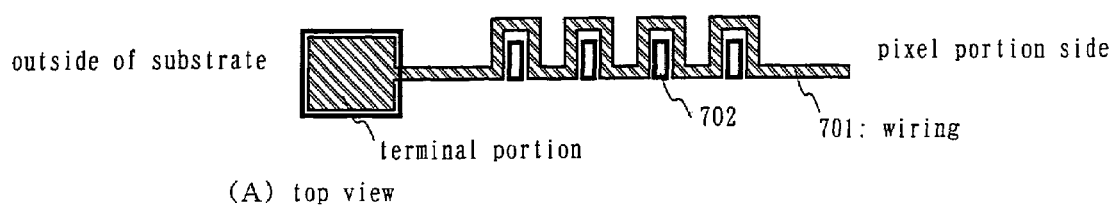
(A) top view
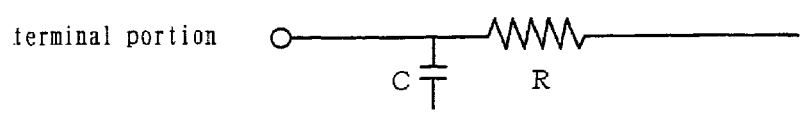
(B) diagram of circuit

[FIG. 20]
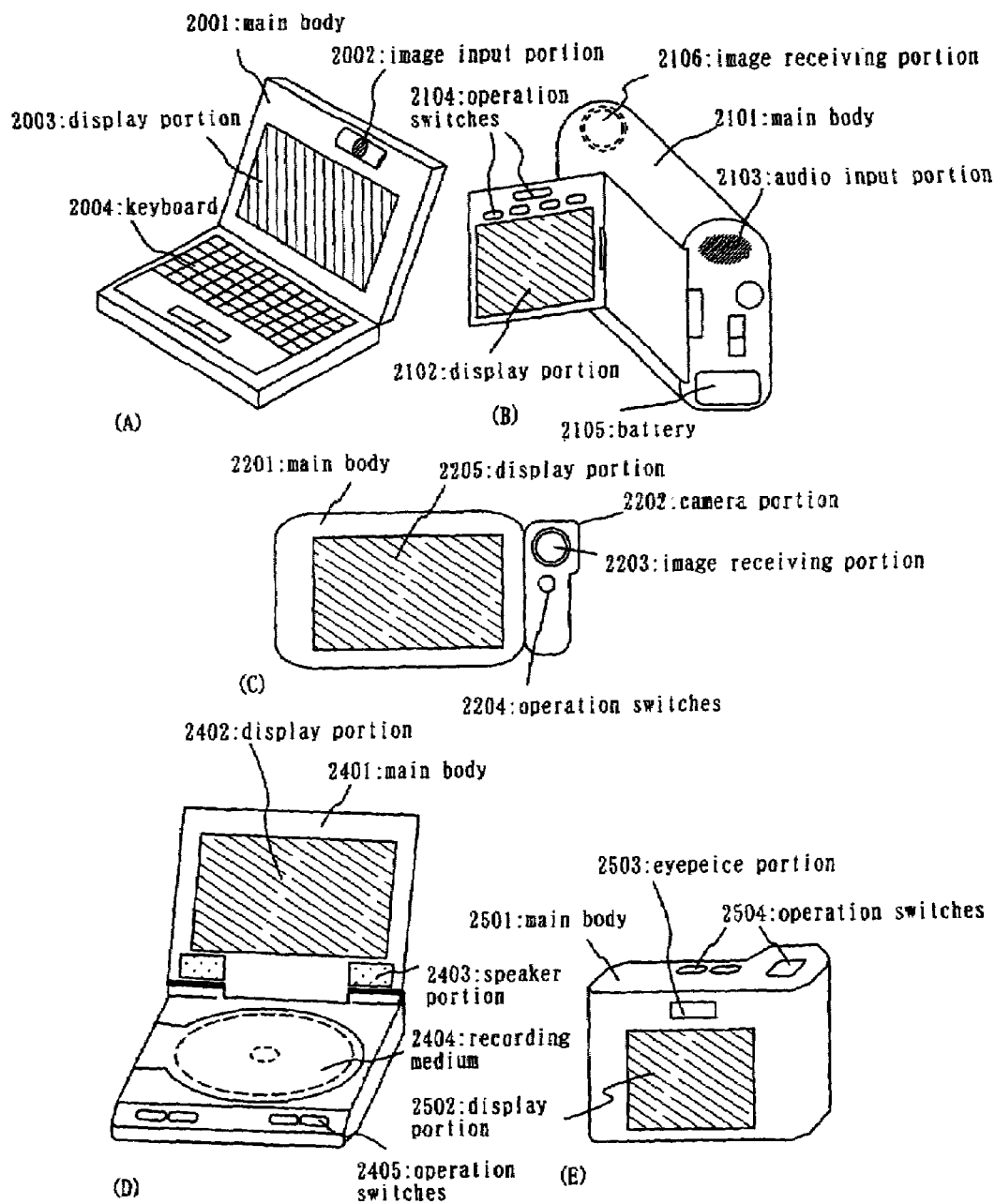

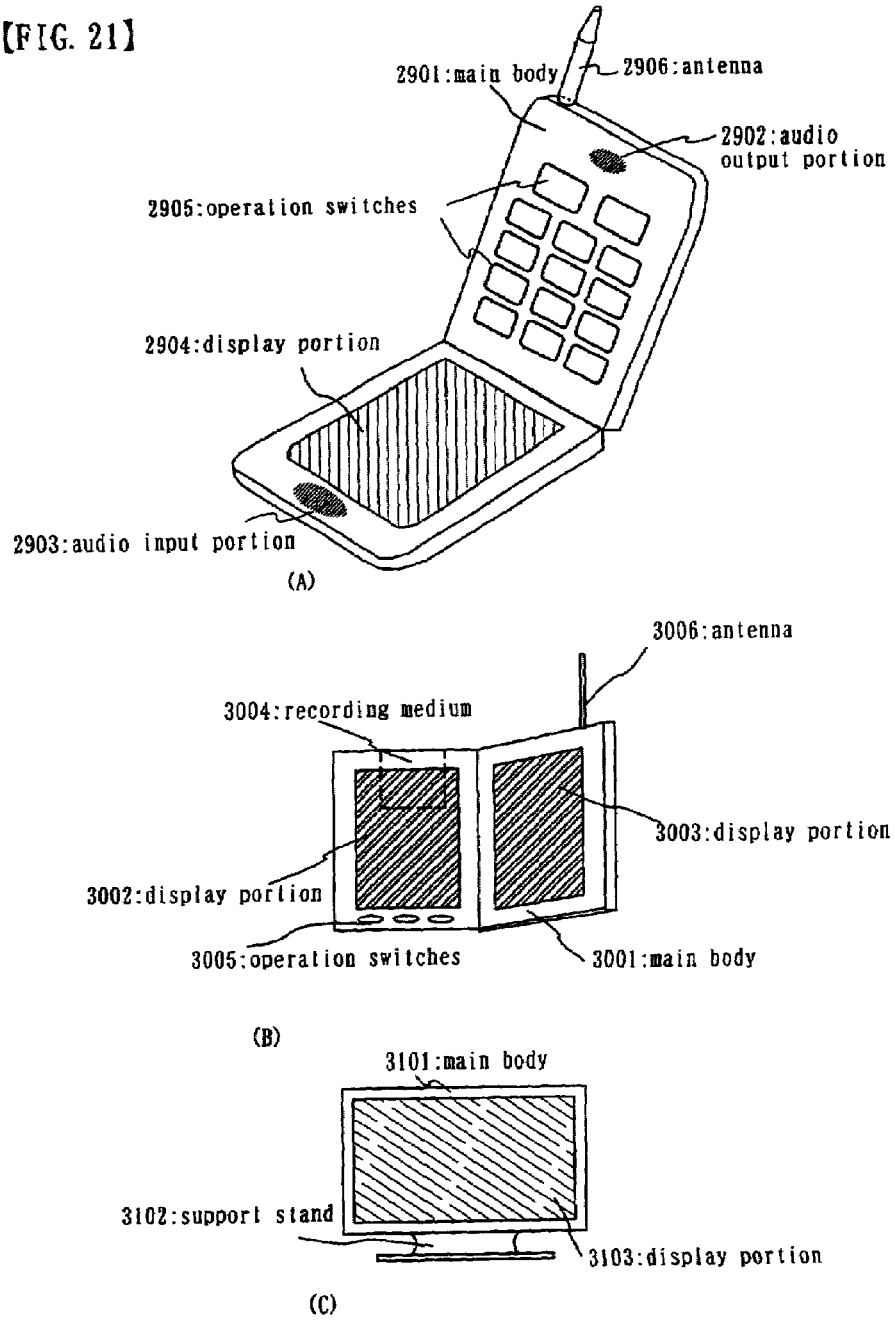

LIQUID CRYSTAL DISPLAY DEVICE AND MANFACTURING METHOD THEREOF

BACKGROUND OF THE INVENTION

1. Technical Field to which the Invention Belongs

The present invention relates to a semiconductor device having a circuit composed of a thin film transistor (hereafter referred to as TFT), and to a method of manufacturing thereof. For example, the present invention relates to an electro-optical device, typically a liquid crystal display panel, and to electronic equipment loaded with this type of electro-optical device as a part.

2. Prior Art

In recent years, techniques of structuring a thin film transistor (TFT) by using a semiconductor thin film (with a thickness on the order of several nm to several hundred of nm) formed on a substrate having an insulating surface have been in the spotlight. The thin film transistor is being widely applied in an electronic device such as an IC or an electro-optical device, and in particular, its development as a switching element of an image display device has been proceeding rapidly.

Conventionally, a liquid crystal display device is known as an image display device. Active matrix type liquid crystal display devices have come into widespread due to the fact that, compared to passive type liquid crystal display devices, a higher definition image can be obtained. By driving pixel electrodes arranged in a matrix state in the active matrix type liquid crystal display device, a display pattern is formed on a screen. In more detail, by applying a voltage between a selected pixel electrode and an opposing electrode corresponding to the pixel electrode, optical modulation of a liquid crystal layer arranged between the pixel electrode and the opposing electrode is performed, and the optical modulation is recognized as a display pattern by an observer.

The use of this type of active matrix type electro-optical device is spreading, and along with making the screen size larger, demands for higher definition, higher aperture ratio, and higher reliability are increasing. Further, at the same time, demands are increasing for improving productivity and lowering costs.

Conventionally, a TN mode oriented with a 90° twist between the direction of light incident to a liquid crystal molecules and the direction of light emitted from the liquid crystal molecules is generally used as an orientation mode of a liquid crystal layer used by a transmitting type liquid crystal display device.

When manufacturing the TN mode liquid crystal display device, an orientation film is formed on one substrate and on another substrate, and a process such as a rubbing process is performed in order to set the orientation direction of the liquid crystal. These substrates are then put together such that the rubbing directions of the substrates are perpendicular to each other. By injecting a liquid crystal material, in which a chiral material for determining the twist rotation direction has been mixed in, between the pair of substrates, a liquid crystal display device having a preset twist direction is formed.

At this point, the major axis of the liquid crystal molecules is arranged parallel with respect to the substrate surface in order to have the energetically most stable arrangement, and depending upon the rubbing conditions and orientation film material, the liquid crystals are arranged possessing an angle from several degrees to approximately 10° with respect to the substrate surface.

This angle is referred to as pre-tilt angle, and by maintaining this pre-tilt angle, change of the arrangement occurs by a predetermined lining up of an edge portion in both edge portions of the major axes of the liquid crystal molecules when an electric field is applied. The orientation thus becomes continuous during operation, and an orientation defect referred to as reverse tilt domain during display can be prevented.

However, with the above TN mode, the contrast characteristics deteriorate extremely outside a specific viewing range, and a problem of a phenomenon referred to as reverse gradation develops.

This is because light having different optical modulation is seen due to: changes in arrangement, in which the orientation state of the liquid crystal molecules becomes vertical with respect to the substrate surface due to the electric field; and changes in the light advancement distance within the liquid crystal layer, and changes in the index of refraction of the light during transmission, depending upon the viewing angle and position at which an observer watches the liquid crystal display device.

Further, the liquid crystal molecules near the interface with the substrate receive strongly regulated orientation with this mode, and the initial orientation state is nearly maintained. Therefore, even if a very high liquid crystal saturation voltage (5V or more) is applied, the liquid crystal molecules in this neighborhood will not become vertical.

These are considered the primary factors causing the narrowing of the field of view characteristics of the TN mode.

In addition, a perpendicular orientation type liquid crystal mode is known as another liquid crystal display mode. The perpendicular orientation type liquid crystal mode is an orientation mode in which the initial orientation of the liquid crystals is vertical with respect to the substrate. An n-type liquid crystal material possessing negative dielectric anisotropy is used in this mode. Display is realized for this mode as well by applying an electric field between electrodes formed on the substrates.

However, because this is a mode which utilizes the double refraction of the liquid crystal, a small amount of dispersion in the pre-tilt angle is conspicuous as a dispersion in the amount of light transmitted or in the amount of light reflected. Small differences in the contact of the brush tip during the rubbing process become a cause of wavy display, which easily becomes a problem.

Further, the rubbing process itself is a process of rubbing the surface of the orientation film on the substrate with a soft hairs, and therefore this becomes a source of dust contamination. In addition, it is necessary to have sufficient counter measures against stress and deterioration of the elements on the substrate which accompanies the generation of static electricity.

Therefore, a method of orienting the liquid crystals and realizing a uniform orientation without performing the rubbing process has generally been searched for. For example, a means of manufacturing a liquid crystal display device is known in which a structure is formed on the substrate, and physical parameters such as the slope of the face of the structure which contacts the liquid crystal, the gap, and the height are regulated, and in addition, by controlling orientation together with the electric field action due to the dielectric constant of the structure. A wide angle of view equal to or greater than 160° can thus be realized by this method. However, although the conventional rubbing process becomes unnecessary with this method, complicated additional processes are required in order to orient the liquid crystal.

SUMMARY OF THE INVENTION

Problems to be Solved by the Invention

Conventionally, TFTs are manufactured on a substrate by a photolithography technique using a minimum of 5 or more photomasks for an active matrix type electro-optical device, and therefore the production cost is large. In order to increase productivity and improve yield, an effective means in which the number of steps is reduced has been considered.

Specifically, it is necessary to reduce the number of photomasks needed to produce the TFT. The photomask is used in a photolithography technique in order to form a photoresist pattern, which becomes an etching process mask, on the substrate.

By using one photomask, there are applied with steps such as applying resist, pre-baking, exposure, development, and post-baking, and steps of film deposition and etching before and after, and in addition, resist peeling, cleaning, and drying steps are added. Therefore, the entire process becomes complex, which leads to a problem.

Further, static electricity is generated by causes such as friction during manufacturing steps because the substrate is an insulator. If static electricity is generated, then short circuits develop at an intersection portion of wirings formed on the substrate, and deterioration or breakage of the TFT due to static electricity leads to display faults or deterioration of image quality in electro-optical devices. In particular, static electricity develops during rubbing in the liquid crystal orienting process performed in the manufacturing steps, and this becomes a problem.

The present invention is for answering these types of problems, and an object of the present invention is to realize a lowering of the production cost and a raise in the yield by: manufacturing an electro-optical device, typically an active matrix type liquid crystal display device, by cutting the rubbing process; and additionally, by reducing the number of steps for the manufacture of TFTs.

In addition, an object of the present invention is to improve the viewing angle characteristics of the liquid crystal display device.

Means for Solving the Problem

A structure of the present invention disclosed by this specification is a liquid crystal display device having a pair of substrates and a liquid crystal maintained between the pair of substrates, characterized in that
formed on one substrate of the pair of substrates are:
a gate wiring;
an insulating film on the gate wiring;
an amorphous semiconductor film on the insulating film;
a source region and a drain region on the amorphous semiconductor film;
a source wiring or an electrode on the source region or the drain region;
a pixel electrode formed on the electrode; and
a gap retaining material formed for maintaining a constant gap between the pair of substrates, and characterized in that
a pre-tilt angle of the liquid crystal is controlled by a side face of the gap retaining material, orienting the liquid crystal.

Further, another structure of the present invention is a liquid crystal display device having a pair of substrates and a liquid crystal maintained between the pair of substrates, characterized in that
formed on one substrate of the pair of substrates are:
a gate wiring;
an insulating film on the gate wiring;
an amorphous semiconductor film on the insulating film;
a source region and a drain region on the amorphous semiconductor film;
a source wiring or an electrode on the source region or the drain region;
a pixel electrode formed on the electrode; and
a gap retaining material formed for maintaining a constant gap between the pair of substrates, and characterized in that
a pre-tilt angle of the liquid crystal is controlled by a side face of the gap retaining material, and a concave portion or a convex portion formed on at least one of the substrates, orienting the liquid crystal.

In each of the above structures, at least one of the substrates has an orientation film used for perpendicular orientation.

Further, the gap retaining material has a constant taper angle in each of the above structures. The taper angle is from 75.0° to 89.9°, preferably from 82° to 87°. Furthermore, the gap retaining material is: an organic resin material having at least one material chosen from the group consisting of acrylics, polyimides, polyimide amines, and epoxies as its main constituent; or an inorganic material chosen from the group consisting of silicon oxide, silicon nitride, and silicon nitride oxide, or a lamination film of such materials.

Further, the major axis direction of the liquid crystal molecules in the vicinity of the side face of the gap retaining material has strongly regulated orientation so as to be roughly parallel with respect to the side face in each of the above structures.

In addition, in each of the above structures, the liquid crystal has negative dielectric anisotropy.

Furthermore, one end surface of the drain region or the source region roughly coincides with an end surface of the amorphous semiconductor film and an end surface of the electrode in each of the above structures.

Further, in each of the above structures:
one end surface of the drain region or the source region roughly coincides with an end surface of the amorphous semiconductor film and an end surface of the electrode; and
another end surface of the drain region or the source region roughly coincides with an end surface of the pixel electrode and another end surface of the electrode.

Further, each of the above structures is characterized in that the source region and the drain region is made from an amorphous semiconductor film containing an impurity element which imparts n-type conductivity.

Still further, each of the above structures is characterized in that the insulating film, the amorphous semiconductor film, the source region, and the drain region are formed in succession without exposure to the atmosphere.

In addition, each of the above structures is characterized in that the insulating film, the amorphous semiconductor film, the source region, or the drain region is formed by a sputtering method.

In addition, each of the above structures is characterized in that the insulating film, the amorphous semiconductor film, the source region, or the drain region is formed by a plasma CVD method.

In addition, each of the above structures is characterized in that the source region and the drain region are formed by using the same mask as that of the amorphous semiconductor film and the electrode.

In addition, each of the above structures is characterized in that the source region and the drain region are formed by using the same mask as that of the source wiring.

Furthermore, each of the above structures is characterized in that the source region and the drain region are formed by using the same mask as that of the source wiring and the pixel electrode.

Further, each of the above structures is characterized in that the pixel electrode contacts the insulating film.

Additionally, each of the above structures is characterized in that the film thickness of regions of the amorphous semiconductor film which contact the source region and the drain region is thicker than the film thickness of a region between the region contacting the source region and the region contacting the drain region, the regions functioning as an active layer of a channel etch type TFT.

Still further, each of the above structures is characterized in that the region of the amorphous semiconductor film between the region contacting the source region and the region contacting the drain region is protected by being covered by the gap retaining material made from the inorganic insulating film.

A structure of the present invention to realize the above structures is a method of manufacturing a liquid crystal display device, characterized by having:

a first step of forming a gate wiring on a first substrate by using a first mask;

a second step of forming an insulating film covering the gate wiring;

a third step of forming a first amorphous semiconductor film on the insulating film;

a fourth step of forming a second semiconductor film, containing an impurity element which imparts n-type conductivity, on the first amorphous semiconductor film;

a fifth step of forming a first conductive film on the second amorphous semiconductor film;

a sixth step of:
patterning the first amorphous semiconductor film by using a second mask;
patterning the second amorphous semiconductor film by using the second mask; and
patterning the first conductive film by using the second mask, forming a wiring from the first conductive film;

a seventh step of forming a second conductive film contacting and overlapping the wiring;

an eighth step of:
patterning the second conductive film by using a third mask, forming a pixel electrode made from the second conductive film;
patterning the wiring by using the third mask, forming a source wiring and an electrode;
patterning the second amorphous semiconductor film by using the third mask, forming a source region and a drain region made from the second amorphous semiconductor film; and
removing a portion of the first amorphous semiconductor film by using the third mask;

a ninth step of forming an orientation film on the pixel electrode;

a tenth step of forming a gap retaining material on the orientation film;

an eleventh step of joining together the first substrate and a second substrate; and a twelfth step of injecting a liquid crystal between the first substrate and the second substrate.

The above structure is characterized in that the gap retaining material maintains a gap between the first substrate and the second substrate at a fixed distance.

Further, in the above structure, a pre-tilt angle of the liquid crystal is controlled by a side surface of the gap retaining material, orienting the liquid crystal. Furthermore, control of the pre-tilt angle of the liquid crystal is performed by using the orientation film. The orientation film may be formed on one of the first substrate and the second substrate, or may be formed on both substrates.

EMBODIMENT MODE OF THE INVENTION

Embodiment modes of the present invention will be explained below.

The present invention is characterized by, in order to solve the above problems, employing a channel etch type bottom gate TFT structure and by performing patterning of a source region and a drain region with the same photomask as that used for patterning of a pixel electrode.

A method of manufacturing the present invention is explained simply below.

First, a gate wiring 102 is formed using a first mask (photomask number 1).

Next, an insulating film (gate insulating film) 104a, a first amorphous semiconductor film 105, a second amorphous semiconductor film 106 containing an impurity element which imparts n-type conductivity, and a first conductive film 107 are formed and laminated in order. (See FIG. 2(A).) Note that a microcrystalline semiconductor film may be used as a substitute for the amorphous semiconductor film, and that a microcrystalline semiconductor film containing an impurity element which imparts n-type conductivity may be used as a substitute for the amorphous semiconductor film containing the impurity element which imparts n-type conductivity. In addition, these films (104a, 105, 106, and 107) can be formed by sputtering or plasma CVD in succession inside a plurality of chambers, or within the same chamber, without exposure to the atmosphere. The mixing in of impurities can be prevented by having no exposure to the atmosphere.

Next, using a second mask (photomask number 2): a wiring (later becoming a source wiring and an electrode (drain electrode)) 111 made from the first conductive film is formed by patterning the first conductive film 107; a second amorphous semiconductor film 110 containing the impurity element which imparts n-type conductivity is formed by patterning the second amorphous semiconductor film 106; and a first amorphous semiconductor film 109 is formed by patterning the first amorphous semiconductor film 105. (See FIG. 2(B).)

A second conductive film 112 is deposited on the entire surface afterward. (See FIG. 2(D).) Note that a transparent conductive film may be used as the second conductive film 112, and that a conductive film having reflective characteristics may also be used.

Next, by using a third mask (photomask number 3): a pixel electrode 119 made from the second conductive film is formed by patterning the second conductive film 112; a source wiring 117 and an electrode (drain electrode) 118 are formed by patterning the wiring; a source region 115 and a drain region 116 made from the second amorphous semiconductor film containing the impurity element which imparts n-type conductivity are formed by patterning the second amorphous semiconductor film 110 containing the impurity element which imparts n-type conductivity; and a first amorphous semiconductor film 114 is formed by removing a portion of the first amorphous semiconductor film 109. (See FIG. 3(A).)

By using this type of constitution, the number of photomasks used in the photolithography technique can be set to 3 when manufacturing a pixel TFT portion.

In addition, the liquid crystal display device is manufactured by the present invention without increasing the number of steps and without performing a rubbing process.

A gap retaining material is formed in order to maintain a constant gap between a pair of substrates (a substrate 100 and an opposing substrate 124) with the present invention, as shown in FIG. 1. As the gap retaining material here, wall spacers 121 and 122 are given sloped side faces and control a pre-tilt angle of a liquid crystal having negative dielectric anisotropy, orienting the liquid crystal.

The cross sectional shape of the wall spacers 121 and 122 is, for example, set to that of FIG. 17(a) or FIG. 17(b) throughout this specification. In particular, a taper angle $\alpha$ such as that of FIG. 17(a) is defined as the angle between the bottom face and the side face of the trapezoid-shape cross section. It is preferable to set the taper angle $\alpha$ from 75.0° to 89.9°, more preferably between 82° and 87°, in the present invention.

The orientation of the liquid crystal molecules within FIG. 1 shows a schematic diagram when no voltage is applied. Note that portions painted black show edge portions of the liquid crystal molecules close to the opposing substrate.

When there is no applied voltage, the liquid crystal molecules receive regulation power from the side faces of the wall-like spacers, are oriented nearly parallel to the side faces, and are oriented perpendicular to the substrate surface having a certain pre-tilt angle, but when there is an applied voltage, the liquid crystal molecules are oriented parallel to the substrate surface.

In other words, by using the wall-like spacers having side faces with the taper angle $\alpha$, the switching direction of the liquid crystal molecules can be controlled.

Further, the wall-like spacers are formed by a photolithography method or by a printing method. In addition, an orientation film used for perpendicular orientation is formed either before or after forming the wall-like spacers.

Furthermore, the wall-like spacers may be formed on only the substrate 100, or on only the opposing substrate 124. The wall-like spacers may also be formed on both the substrate 100 and the opposing substrate 124. Provided that a reduction in the number of photomasks during manufacture of an active matrix substrate is given priority, it is preferable to use a method of formation by printing, or it is preferable to form the wall-like spacers only on the opposing substrate. When applying the liquid crystal display device in which the wall-like spacers are only formed on the opposing substrate to a normally white mode, a portion in which there is orientation disorder in the periphery of the wall-like spacers, or a portion having non-uniform threshold voltage due to disordered orientation, is hidden from the recognition of the user of the display by the wall-like spacers themselves, and light leakage can be reduced. Therefore, a high contrast, high-grade display liquid crystal display device can be obtained by suppressing light leakage through the wall-like spacers.

An organic resin material having at least one material chosen from the group consisting of acrylics, polyimides, polyimide amines, and epoxies as its main constituent; or an inorganic material chosen from the group consisting of silicon oxide, silicon nitride, and silicon nitride oxide, or a lamination film of such materials can be used as the material for the wall-like spacers.

Furthermore, when an inorganic material, for example silicon nitride, is used for the wall-like spacers in the above channel etch TFT, in particular, when the spacers are arranged so as to cover a portion of the amorphous semiconductor film 114 which is exposed, then an effect as a protecting film can be obtained, and the reliability is increased.

In addition, the pre-tilt angle of the liquid crystal may be controlled and the liquid crystal may be oriented both by an uneven portion formed by arranging wirings such as the gate wiring, the source wiring, and a capacitor wiring, and the electrode in suitable preset locations, and by the wall-like spacers arranged in suitably preset locations.

When using the present invention, the orientation process corresponding to the rubbing process which leads to static electricity damage can be omitted, and further, the wall-like spacers possess a role of maintaining the substrate gap, and therefore it is possible to omit a ball shape spacer spraying step, and the productivity is increased. In addition, the present invention has the advantage of being able to predict the development of display unevenness by only investigating the uniformity of the wall-like spacers formed on the substrate.

Furthermore, it is possible to have a stripe shape, a T-shape, or a ladder-like as the shape of the wall-like spacers when seen from above, but the embodiment mode of the present invention is not limited to these shapes.

A more detailed explanation of the present invention having the above constitution is performed using the embodiments shown below.

BRIEF DESCRIPTION OF THE DRAWINGS

FIG. 1 is a diagram showing a cross-sectional view and a liquid crystal molecule orientation state of the present invention.

FIG. 2 is a cross-sectional view showing a process of manufacturing an active matrix substrate.

FIG. 3 is a cross-sectional view showing the process of manufacturing the active matrix substrate.

FIG. 4 is a top view showing the process of manufacturing the active matrix substrate.

FIG. 5 is a top view showing the process of manufacturing the active matrix substrate.

FIG. 6 is a top view showing the process of manufacturing the active matrix substrate.

FIG. 7 is a top view explaining the placement of the pixel portion and the input terminal portion of the liquid crystal display panel.

FIG. 8 is a cross-sectional view showing an example of a method of mounting a liquid crystal display panel.

FIG. 9 is a top view and a cross-sectional view showing the input terminal portion.

FIG. 10 is a top view showing the manufacturing apparatus.

FIG. 11 is a top view showing the manufacturing apparatus.

FIG. 12 is a diagram showing an example of a method of mounting the liquid crystal display panel.

FIG. 13 is a cross-sectional view showing an example of a method of mounting a liquid crystal display panel.

FIG. 14 is a diagram showing a cross-sectional view and a liquid crystal molecule orientation state of the present invention.

FIG. 15 is a diagram showing a cross-sectional view and a liquid crystal molecule orientation state of the present invention.

FIG. 16 is a diagram showing a cross-sectional view and a liquid crystal molecule orientation state of the present invention.

FIG. 17 is a diagram showing perspective views of wall-like spacers of the present invention.

FIG. 18 is a diagram showing top views of wall-like spacers of the present invention.

FIG. 19 is a top view and a circuit diagram of a protecting circuit.

FIG. 20 is a diagram showing examples of electronic equipment.

FIG. 21 is a diagram showing examples of electronic equipment.

DESCRIPTION OF THE PREFERRED EMBODIMENTS

Embodiment 1

An embodiment of the invention is explained using FIGS. 1 to 7, 9 and 17. Embodiment 1 shows a method of manufacturing a liquid crystal display panel, and a detailed explanation of a method of forming a TFT of a pixel portion on a substrate by a reverse stagger type TFT, and manufacturing a storage capacitor connected to the TFT, is made in accordance with the processes used. Further, a manufacturing process for a terminal section, formed in an edge portion of the substrate, and for electrically connecting to wirings of circuits formed on other substrates, is shown at the same time in the same figures.

In FIG. 2(A), a glass substrate, comprising such as barium borosilicate glass or aluminum borosilicate glass, typically Corning Corp. #7059 or #1737, can be used as a substrate 100 having translucency. In addition, a translucent substrate such as a quartz substrate or a plastic substrate can also be used.

Next, after forming a conductive layer on the entire surface of the substrate, a first photolithography process is performed, a resist mask is formed, unnecessary portions are removed by etching, and wirings and electrodes (the gate wiring 102 including a gate electrode, a capacitor wiring 103 and a terminal 101) are formed. Etching is performed at this time to form a tapered portion in at least an edge portion of the gate electrode 102. A top view of this stage is shown in FIG. 4.

It is preferable to form the gate wiring 102 including the gate electrode, the capacitor wiring 103, and the terminal 101 of the terminal section from a low resistivity conductive material such as aluminum (Al) or copper (Cu), but simple Al has problems such as inferior heat resistance and easily corrodes, and therefore it is combined with a heat resistant conductive material. Further, an Ag—Pd—Cu alloy may also be used as the low resistance conductive material. One element selected from the group consisting of titanium (Ti), tantalum (Ta), tungsten (W), molybdenum (Mo), chromium (Cr), or an alloy comprising the above elements, or an alloy film of a combination of the above elements, or a nitrated compound comprising the above elements is formed as the heat resistant conductive material. For example, a lamination film of Ti and Cu, and a lamination film of TaN and Cu can be given. Furthermore, forming in combination with a heat resistant conductive material such as Ti, Si, Cr, or Nd, it is preferable because of improved levelness. Further, only such heat resistant conductive film may also be formed, for example, a combination of Mo and W may be formed.

In realizing the liquid crystal display device, it is preferable to form the gate electrode and the gate wiring by a combination of a heat resistant conductive material and a low electrical resistance conductive material. An appropriate combination in this case is explained.

Provided that the screen size is on the order of, or less than, 5 inch diagonal type, a two layer structure of a lamination of a conductive layer (A) made from a nitride compound of a heat resistant conductive material, and a conductive layer (B) made from a heat resistant conductive material is used. The conductive layer (B) may be formed from an element selected from the group consisting of Al, Cu, Ta, Ti, W, Nd, and Cr, or from an alloy of the above elements, or from an alloy film of a combination of the above elements, and the conductive layer (A) is formed from a film such as a tantalum nitride (TaN) film, a tungsten nitride (WN) film, or a titanium nitride (TiN) film. For example, it is preferable to use a double layer structure of a lamination of Cr as the conductive layer (A) and Al containing Nd as the conductive layer (B). The conductive layer (A) is given a thickness of 10 to 100 nm (preferably between 20 and 50 nm), and the conductive layer (B) is made with a thickness of 200 to 400 nm (preferably between 250 and 350 nm).

On the other hand, in order to be applied to a large screen, it is preferable to use a three layer structure of a lamination of a conductive layer (A) made from a heat resistant conductive material, a conductive layer (B) made from a low electrical resistance conductive material, and a conductive layer (C) made from a heat resistant conductive material. The conductive layer (B) made from the low electrical resistance conductive material is formed from a material comprising aluminum (Al), and in addition to pure Al, Al containing between 0.01 and 5 atomic % of an element such as scandium (Sc), Ti, Nd, or silicon (Si) is used. The conductive layer (C) is effective in preventing generation of hillocks in the Al of the conductive layer (B). The conductive layer (A) is given a thickness of 10 to 100 nm (preferably between 20 and 50 nm), the conductive layer (B) is made from 200 to 400 nm thick (preferable between 250 and 350 nm), and the conductive layer (C) is from 10 to 100 nm thick (preferably between 20 and 50 nm). In Embodiment 1, the conductive layer (A) is formed from a Ti film with a thickness of 50 nm, made by sputtering with a Ti target, the conductive layer (B) is formed from an Al film with a thickness of 200 nm, made by sputtering with an Al target, and the conductive layer (C) is formed from a 50 nm thick Ti film, made by sputtering with a Ti target.

An insulating film 104a is formed next on the entire surface. The insulating film 104a is formed using sputtering, and has a film thickness of 50 to 200 nm.

For example, a silicon nitride film is used as the insulating film 104a, and formed to a thickness of 150 nm. Of course, the gate insulating film is not limited to this type of silicon nitride film, and another insulating film such as a silicon oxide film, a silicon oxynitride film, or a tantalum oxide film may also be used, and the gate insulating film may be formed from a single layer or a lamination structure made from these materials. For example, a lamination structure having a silicon nitride film as a lower layer and a silicon oxide film as an upper layer may be used.

Next, a first amorphous semiconductor film 105 is formed with a thickness of 50 to 200 nm (preferably between 100 and 150 nm) on the insulating film 104a over the entire surface by using a known method such as plasma CVD or sputtering (not shown in the figure). Typically, an amorphous silicon (a-Si) film is formed with a thickness of 100 nm by sputtering using a silicon target. In addition, it is also possible to apply a microcrystalline semiconductor film, or a compound semiconductor film having an amorphous structure, such as an amorphous silicon germanium film ($Si_xGe_{(1-x)}$, where $0<x<1$), or an amorphous silicon carbide ($Si_xC_y$).

A second amorphous semiconductor film which contains an impurity element imparting one conductivity type (n-type or p-type) is formed next with a thickness of 20 to 80 nm. The second amorphous semiconductor film which contains an impurity element imparting one conductivity type (n-type or p-type) is formed on the entire surface by a known method such as plasma CVD or sputtering. In this Embodiment, the second amorphous semiconductor film 106, containing an n-type impurity element, is formed using a silicon target in which phosphorous (P) has been added. Alternatively, film deposition may be performed by sputtering using a silicon target in an atmosphere containing phosphorous. In addition, the second amorphous semiconductor film, containing an n-type impurity element may also be formed from a hydrogenated microcrystalline silicon film (μc-Si:H).

Next, a first conductive film 107 made from a metallic material is formed by sputtering or vacuum evaporation. Provided that ohmic contact with the second amorphous semiconductor film 106 can be made, there are no particular limitation on the material of the first semiconductor film 107, and an element selected from the group consisting of Al, Cr, Ta, and Ti, or an alloy comprising the above elements, and an alloy film of a combination of the above elements or the like can be given. Sputtering is used in Embodiment 1, and a 50 to 150 nm thick Ti film, an aluminum (Al) film with a thickness between 300 and 400 nm above the Ti film, and a Ti film with a thickness of 100 to 150 nm thereon are formed as the first conductive film 107. (FIG. 2(A))

The insulating film 104a, the first amorphous semiconductor film 105, the second amorphous semiconductor film 106 containing an impurity element which imparts n-type conductivity, and the first conductive film 107 are all manufactured by a known method, and can be manufactured by plasma CVD or sputtering. These films (104a, 105, 106, and 107) are formed in succession by sputtering, and suitably changing the target or the sputtering gas in Embodiment 1. The same reaction chamber, or a plurality of reaction chambers, in the sputtering apparatus is used at this time, and it is preferable to laminate these films in succession without exposure to the atmosphere. By thus not exposing the films to the atmosphere, the mixing in of impurities can be prevented.

Next, a second photolithography process is then performed, a resist mask 108 is formed, and by removing unnecessary portions by etching, a wiring (becoming a source wiring and a drain electrode by subsequent processing) 111 is formed. Wet etching or dry etching is used as the etching process at this time. The first conductive film 107, the second amorphous semiconductor film 106 containing an impurity element which imparts n-type conductivity, and the first amorphous semiconductor film 105 are etched in order with the resist mask 108 as a mask. The wiring 111 composed of the first conductive film, a second amorphous conductive film 110 containing an impurity element which imparts n-type conductivity, and a first amorphous semiconductor film 109 are each formed in the pixel TFT portion. In Embodiment 1, the first conductive film 107 in which the Ti film, the Al film, and the Ti film are laminated in order is etched by dry etching using a gas mixture of $SiCl_4$, $Cl_2$, and $BCl_3$ as a reaction gas, and the reaction gas is substituted with a gas mixture of $CF_4$ and $O_2$, and the first amorphous semiconductor film 105 and the second amorphous semiconductor film 106, containing the impurity element for imparting n-type conductivity, are selectively removed. (FIG. 2(B)) Further, the capacitor wiring 103 and the insulating film 104a remain in a capacitor portion, and the terminal 101 and the insulating film 104a also remain similarly in a terminal portion.

Next, after removing the resist mask 108, a resist mask is formed using a shadow mask, and the insulating film 104a covering the pad portion of the terminal portion is selectively removed, forming an insulating film 104b, after which the resist mask is removed. (FIG. 2(C)) Further, as a substitute for the shadow mask, a resist mask may also be formed by screen printing as an etching mask.

A second conductive film 112 is deposited next on the entire surface from a transparent conductive film. (FIG. 2(D)) Further, a top view at this point is shown in FIG. 5. Note that, for simplification, the second conductive film 112 formed on the entire surface is not shown in FIG. 5.

The second conductive film 112 is formed from a material such as indium oxide ($In_2O_3$) or indium oxide tin oxide alloy ($In_2O_3$—$SnO_2$, abbreviated as ITO) using a method such as sputtering or vacuum evaporation. The etching process for this type of material is performed using a solution of hydrochloric acid type. However, a residue is easily generated, particularly by ITO etching, and therefore an indium oxide zinc oxide alloy ($In_2O_3$—ZnO) may be used in order to improve the etching workability. The indium oxide zinc oxide alloy has superior surface smoothing characteristics, and has superior thermal stability compared to ITO, and therefore even if the wiring 111 contacting the second conductive film 112 is made from an Al film, a corrosion reaction can be prevented. Similarly, zinc oxide (ZnO) is also a suitable material, and in addition, in order to increase the transmittivity of visible light and increase the conductivity, a material such as zinc oxide in which gallium (Ga) is added (ZnO:Ga) can be used.

Resist masks 113a to 113c are formed next by a third photolithography process. Unnecessary portions are then removed by etching, forming a first amorphous semiconductor film 114, a source region 115, a drain region 116, the source electrode 117, the drain electrode 118, and the pixel electrode 119. (FIG. 3(A))

The third photolithography process patterns the second conductive film 112, and at the same time removes a part of the wiring 111, the second amorphous semiconductor film 110 containing an impurity element which imparts n-type conductivity and the first amorphous semiconductor film 109 by etching, forming an opening. In Embodiment 1, the second conductive film 112 made from ITO is selectively removed first by wet etching using a mixed solution of nitric acid and hydrochloric acid, or a ferric chloride solution, and after selectively removing the wiring 111 by wet etching, a portion of the second amorphous semiconductor film 110 containing the impurity element which imparts n-type conductivity and the amorphous semiconductor film 109 are etched by dry etching. Note that wet etching and dry etching are used in Embodiment 1, but the operator may perform only dry etching by suitably selecting the reaction gas, and the operator may perform only wet etching by suitably selecting the reaction solution.

Further, the lower portion of the opening reaches the first amorphous semiconductor film, and the first amorphous semiconductor film 114 is formed having a concave portion. The wiring 111 is separated into the source wiring 117 and the drain electrode 118 by the opening, and the second amorphous semiconductor film 110, containing an impurity element which imparts n-type conductivity, is separated into the source region 115 and the drain region 116. Furthermore, the second conductive film 120 contacting the source wiring covers the source wiring, and during subsequent manufacturing processes, especially during a rubbing process, fulfills a role of preventing static electricity from developing. An example of forming the second conductive film 120 on the source wiring is shown in this Embodiment, but the second conductive film 120 may also be removed.

Moreover, a storage capacitor is formed in the third photolithography process by the capacitor wiring 103 and the pixel electrode 119, with the insulating film 104b in the capacitor portion as a dielectric.

In addition, the second conductive film made from the transparent conductive film formed in the terminal portion and covered by the resist mask 113c remains after the third photolithography process.

The resist masks 113a to 113c are removed next. A cross section diagram of this state is shown in FIG. 3(B). Note that FIG. 6 is a top view of one pixel, and FIG. 3(B) corresponds to cross sections taken along the lines A-A' and B-B'.

Furthermore, FIG. 9(A) shows top views of a gate wiring terminal portion 501 and a source wiring terminal portion 502 in this state. Note that the same symbols are used for area corresponding to those of FIG. 1 to FIG. 3. Further, FIG. 9(B) corresponds to a cross-sectional view taken along the lines E-E' and F-F' in FIG. 9(A). Reference numeral 503 in FIG. 9(A) denotes a connecting electrode made from a transparent conductive film and functioning as an input terminal. In addition, in FIG. 9(B) reference numeral 504 denotes an insulating film (extended from 104b), reference numeral 505 denotes a first amorphous semiconductor film (extended from 114), and reference numeral 506 denotes a second amorphous semiconductor film containing an impurity element which imparts n-type conductivity (extended from 115).

By thus using three photomasks and performing three photolithography processes, the pixel TFT portion having the reverse stagger type n-channel type TFT 201 and the storage capacitor 202 can be completed. By placing these in a matrix state corresponding to each pixel and thus composing the pixel portion, one substrate can be made in order to manufacture an active matrix type electro-optical device. For convenience, this type of substrate is referred to as an active matrix substrate throughout this specification.

Alignment films 131 and 132 are next formed on the active matrix substrate. JALS-2021 (manufactured by JSR Corp.) is formed by printing here and then fired.

After forming the alignment films, a gap holding member which holds the substrate gap, a wall-like spacer 127 shown in FIG. 17(a) in this Embodiment, is formed by performing the fourth photolithography process. Further, a process of exposing light to the negative type resin from the back side of the substrate may be used. Further, it is possible to form the wall-like spacer having the above described shape by using dry etching or plasma etching.

NN700 (manufactured by JSR Corp.), which is a material having a photosensitive acrylic material as the principle component, is deposited on the entire surface of the substrate by spinner into 4.2 μm thickness. An acrylic resin is used because of its readiness for formation. The dielectric constant of the acrylic resin NN700 used in the invention is 3.4. A resist mask is next formed, unnecessary portions are removed by etching and a wall-like spacer of the shape as shown in FIG. 17(a) is formed. In case the top portion is made flat, a mechanical strength as a liquid crystal display panel can be secured. According to SEM observation, the height of the wall-like spacer was 4 μm. It is preferable that the taper angle of the wall-like spacer has an angle between 75.0° and 89.9°, preferably between 82° and 87°.

The active matrix substrate, and an opposing substrate 124 on which a wall-like spacer 122 which is similarly formed with the above described wall-like spacer is formed, are next joined together by a sealant while maintaining a gap between the substrates using the wall-like spacers 121 and 122, after which a liquid crystal material 125 is injected into the space between the active matrix substrate and the opposing substrate. A liquid crystal material having a negative dielectric anisotropy (n-type liquid crystal), in this Embodiment MLC-2038 (manufactured by Merck), is used for the liquid crystal material 125. When the pre-tilt angle is measured, the pre-tilt angle is prescribed within a range between 2 and 5°, and it is almost uniform at 3° in the display region. Accordingly the region near the surface of NN700 has an alignment regulating effect which makes the longitudinal axis direction of the liquid crystal molecule approximately parallel with respect to the surface.

After injecting the liquid crystal material, the injecting entrance is sealed by a resin material.

A state shown in FIG. 1 is obtained through the above processes. Note that only the state of 3 wall like spacers and liquid crystal molecules between them are shown in FIG. 1 for the simplification.

In this state the liquid crystal molecules are arranged approximately parallel with the side walls of the wall-like spacers 121 and 122 by the influence of the side walls, when voltage is not applied. Further, the liquid crystal molecules that are not in the proximity of the side walls are also influenced by these liquid crystal molecules. Thus a stable orientation having a pre-tilt angle of several degrees is obtained in the whole pixel. By applying a voltage larger than the threshold voltage of the liquid crystal, a uniform operation is made towards an inclinating direction determined by the pre-tilt angle. Namely, by using the wall-like spacers 121 and 122 the orientation of the whole display portion is controlled.

Further, top views of the wall-like spacers 121 and 122 disposed on the both substrates are shown in FIG. 18(a). The plane cut along the dotted line X-X' corresponds to the cross section of FIG. 1.

Next, a flexible printed circuit (FPC) is connected to the input terminal 101 of the terminal portion. The FPC is formed by a copper wiring 128 on an organic resin film 129 such as polyimide, and is connected to the transparent conductive film covering the input terminal by an anisotropic conductive adhesive. The anisotropic conductive adhesive comprises an adhesive 126 and particles 127, with a diameter of several tens to several hundred of μm and having a conductive surface plated by a material such as gold, which are mixed therein. The particles 127 form an electrical connection in this portion by connecting the transparent conductive film on the input terminal 101 and the copper wiring 128. In addition, in order to increase the mechanical strength of this region, a resin layer 130 is formed. (FIG. 3(C))

FIG. 7 is a diagram explaining the placement of the pixel portion and the terminal portion of the active matrix substrate. A pixel portion 211 is formed on a substrate 210, gate wirings 208 and source wirings 207 are formed intersecting on the pixel portion, and the n-channel TFT 201 connected to this is formed corresponding to each pixel. The pixel electrode 119 and a storage capacitor 202 are connected to the drain side of the n-channel TFT 201, and the other terminal of the storage capacitor 202 is connected to a capacitor wiring 209. The structure of the n-channel TFT 201 and the storage capacitor 202 is the same as that of the n-channel TFT 201 and the storage capacitor 202 shown by FIG. 3(B).

An input terminal portion 205 for inputting a scanning signal is formed in one edge portion of the substrate, and is connected to a gate wiring 208 by a connection wiring 206. Further, an input terminal portion 203 for inputting an image signal is formed in the other edge portion, and is connected to a source wiring 207 by a connection wiring 204. A plurality of the gate wiring 208, the source wiring 207, and the capacitor wiring 209 are formed in accordance with the pixel density. Furthermore, an input terminal portion 212 for inputting an image signal and a connection wiring 213 may be formed, and may be connected to the source wiring alternately with the input terminal portion 203. An arbitrary number of the input terminal portions 203, 205, and 212 are formed, which may be suitably determined by the operator.

Thus an active matrix liquid crystal display panel can be formed in this Embodiment by going through photolithography processes 4 times by using 4 photo-masks.

Though this Embodiment used a wall-like spacer, it is acceptable to use a columnar spacer and the liquid crystal molecules are oriented in multi-domain in its periphery.

Embodiment 2

FIG. 8 is an example of a method of mounting a liquid crystal display device. The liquid crystal display panel has an input terminal portion 302 formed in an edge portion of a substrate 301 on which TFTs are formed, and as shown by embodiment 1, this is formed by a terminal 303 formed from the same material as a gate wiring. An opposing substrate 304 is joined to the substrate 301 by a sealant 305 encapsulating spacers 306, and in addition, polarizing plates 307 and 308, and a color filter (not shown) are formed. This is then fixed to a casing 321 by spacers 322.

Note that the TFT obtained in Embodiment 1 having an active layer formed by an amorphous semiconductor film has a low electric field effect mobility, and only approximately 1 cm$^2$/Vsec is obtained. Therefore, a driver circuit for performing image display is formed by an IC chip, and mounted by a TAB (tape automated bonding) method or by a COG (chip on glass) method. In Embodiment 2, an example is shown of forming the driver circuit in an IC chip 313, and mounting by using the TAB method. A flexible printed circuit (FPC) is used, and the FPC is formed by a copper wiring 310 on an organic resin film 309, such as polyimide, and is connected to the input terminal 302 by an anisotropic conductive adhesive. The input terminal is a transparent conductive film formed on and contacting the wiring 303. The anisotropic conductive adhesive is structured by an adhesive 311 and particles 312, with a diameter of several tens to several hundred of μm and having a conductive surface plated by a material such as gold, which are mixed therein. The particles 312 form an electrical connection in this portion by connecting the input terminal 302 and the copper wiring 310. In addition, in order to increase the mechanical strength of this region, a resin layer 318 is formed.

The IC chip 313 is connected to the copper wiring 310 by a bump 314, and is sealed by a resin material 315. The copper wiring 310 is then connected to a printed substrate 317 on which other circuits such as a signal processing circuit, an amplifying circuit, and a power supply circuit are formed, through a connecting terminal 316. A light source 319 and a light conductor 320 are formed on the opposing substrate 304 and used as a back light in the transmitting liquid crystal display panel.

Accordingly by using a liquid crystal display panel of Embodiment 1 a multi-domain vertical orientation type liquid crystal display device, which has wide viewing angle display with few gap unevenness, can be obtained.

Embodiment 3

In this Embodiment, an example of forming a liquid crystal display panel by forming a protecting film is shown in FIG. 14. Note that this Embodiment is identical to Embodiment 1 through the state of FIG. 3(B), and therefore only points of difference are explained. Further, the same symbols are used for locations corresponding to those in FIG. 3(B).

After first forming through the state of FIG. 3(B) in accordance with Embodiment 1, a thin inorganic insulating film is formed on the entire surface. An inorganic insulating film formed by using plasma CVD or sputtering such as a silicon oxide film, a silicon nitride film, a silicon oxynitride film, or a tantalum oxide film is used as the thin inorganic insulating film, and a single layer or a lamination structure made from these materials may be formed.

A forth photolithography process is performed next, forming a resist mask, and unnecessary portions are removed by etching, forming an insulating film 402 in the pixel TFT portion, and an inorganic insulating film 401 in the terminal portion. These inorganic insulating films 401 and 402 function as passivation films. Further, the thin inorganic insulating film 401 is removed in the terminal portion by the fourth photolithography process, exposing the second conductive film, made from the transparent conductive film, formed on the terminal 101 of the terminal portion.

The state shown in FIG. 14 can be obtained by following the processes on and after of Embodiment 1. Note however the fourth photolithography process of forming a wall-like spacer in Embodiment 1 is referred to as the fifth photolithography process.

The reverse stagger type n-channel TFT and the storage capacitor, protected by the inorganic insulating film, can thus be completed in Embodiment 3 by performing the photolithography process using five photomasks five times in total. By thus structuring the pixel portion by arranging these into a matrix state corresponding to each pixel, one substrate for manufacturing the active matrix liquid crystal display panel can be made.

Note that it is possible to freely combine the constitution of this Embodiment with that of Embodiment 1 or Embodiment 2.

Embodiment 4

In Embodiment 1 an example centering on forming an insulating film, a first amorphous semiconductor film, a second amorphous semiconductor film, containing an impurity element which imparts n-type conductivity, and a first conductive film by sputtering, but this Embodiment shows an example of using plasma CVD to form the films.

The insulating film, the first amorphous semiconductor film, and the second amorphous semiconductor film, containing an impurity element which imparts n-type conductivity are formed by plasma CVD in this Embodiment.

In this Embodiment, a silicon oxynitride film is used as the insulating film, and formed with a thickness of 150 nm by plasma CVD. Plasma CVD may be performed at this point with a power supply frequency of 13 to 70 MHz, preferably between 27 and 60 MHz. By using a power supply frequency of 27 to 60 MHz, a dense insulating film can be formed, and the voltage resistance can be increased as a gate insulating film. Further, a silicon oxynitride film manufactured by adding $N_2O$ to $SiH_4$ and $NH_3$ has a reduction in fixed electric charge density, and therefore is a material which is preferable for this use. Of course, the gate insulating film is not limited to this type of silicon oxynitride film, and a single layer or a lamination structure using other insulating films such as s silicon oxide film, a silicon nitride film, or a tantalum oxide film may be formed. Further, a lamination structure of a silicon nitride film in a lower layer, and a silicon oxide film in an upper layer may be used.

For example, when using a silicon oxide film, it can be formed by plasma CVD using a mixture of tetraethyl orthosilicate (TEOS) and $O_2$, with the reaction pressure set to 40 Pa, a substrate temperature of 250 to 350° C., and discharge at a high frequency (13.56 MHz) power density of 0.5 to 0.8 W/cm$^2$. Good characteristics as the gate insulating film can be obtained for the silicon oxide film thus formed by a subsequent thermal anneal at 300 to 400° C.

Typically, a hydrogenated amorphous silicon (a-Si:H) film is formed with a thickness of 100 nm by plasma CVD as the first amorphous semiconductor film. At this point, plasma CVD may be performed with a power supply frequency of 13 to 70 MHz, preferably between 27 and 60 MHz, in the plasma CVD apparatus. By using a power frequency of 27 to 60 MHz, it becomes possible to increase the film deposition speed, and the deposited film is preferable because it becomes an a-Si film having a low defect density. In addition, it is also possible to apply a microcrystalline semiconductor film and a compound semiconductor film having an amorphous structure, such as an amorphous silicon germanium film, as the first amorphous semiconductor film.

Further, if 100 to 100 k Hz pulse modulation discharge is performed in the plasma CVD film deposition of the insulating film and the first amorphous semiconductor film, then particle generation due to the plasma CVD gas phase reaction can be prevented, and pinhole generation in the formed film can also be prevented, and therefore is preferable.

Further, in this Embodiment a second amorphous semiconductor film, containing an impurity element which imparts n-type conductivity is formed with a thickness of 20 to 80 nm as a semiconductor film containing a single conductivity type impurity element. For example, an a-Si:H film containing an n-type impurity element may be formed, and in order to do so, phosphine ($PH_3$) is added at a 0.1 to 5% concentration to silane ($SiH_4$). Alternatively, a hydrogenated microcrystalline silicon film (μc-Si:H) may also be used as a substitute for the second amorphous semiconductor film 106, containing an impurity element which imparts n-type conductivity.

These films can be formed in succession by appropriately changing the reaction gas. Further, these films can be laminated successively without exposure to the atmosphere at this time by using the same reaction chamber or a plurality of reaction chambers in the plasma CVD apparatus. By thus depositing successively these films without exposing the films to the atmosphere, the mixing in of impurities specifically into the first amorphous semiconductor film can be prevented.

Note that it is possible to combine this Embodiment with any one of Embodiments 1 to 3.

Embodiment 5

Examples are shown in Embodiment 1 and Embodiment 4 of laminating an insulating film, a first amorphous semiconductor film, a second amorphous semiconductor film containing an impurity element which imparts n-type conductivity, and a first conductive film, in order and in succession. An example of an apparatus prepared with a plurality of chambers, and used for cases of performing this type of successive film deposition is shown in FIG. 10.

An outline of an apparatus (successive film deposition system), shown by this Embodiment, is shown in FIG. 10 as seen from above. Reference numerals 10 to 15 in FIG. 10 denote chambers having airtight characteristics. A vacuum evacuation pump and an inert gas introduction system are arranged in each of the chambers.

The chambers denoted by reference numerals 10 and 15 are load-lock chambers for bringing test pieces (processing substrates) 30 into the system. The chamber denoted by reference numeral 11 is a first chamber for deposition of the insulating film 104. The chamber denoted by reference numeral 12 is a second chamber for deposition of the first amorphous semiconductor film 105. The chamber denoted by reference numeral 13 is a third chamber for deposition of the second amorphous semiconductor film 106 which imparts n-type conductivity. The chamber denoted by reference numeral 14 is a fourth chamber for deposition of the first conductive film 107. Further, reference numeral 20 denotes a common chamber of the test pieces, arranged in common with respect to each chamber.

An example of operation is shown below.

After pulling an initial high vacuum state in all of the chambers at first, a purge state (normal pressure) is made by using an inert gas, nitrogen here. Furthermore, a state of closing all gate valves 22 to 27 is made.

First, a cassette 28 loaded with a multiple number of processing substrates is placed into the load-lock chamber 10. After the cassette is placed inside, a door of the load-lock chamber (not shown in the figure) is closed. In this state, the gate valve 22 is opened and one of the processing substrates 30 is removed from the cassette, and is taken out to the common chamber 20 by a robot arm 21. Position alignment is performed in the common chamber at this time. Note that a substrate on which the wirings 101, 102, and 103 are formed, obtained in accordance with Embodiment 1, is used for the substrate 30.

The gate valve 22 is then closed, and a gate valve 23 is opened next. The processing substrate 30 is then moved into the first chamber 11. Film deposition processing is performed within the first chamber at a temperature of 150 to 300° C., and the insulating film 104 is obtained. Note that a film such as a silicon nitride film, a silicon oxide film, a silicon oxynitride film, or a lamination film of these films, can be used as the insulating film. A single layer silicon nitride film is employed in this Embodiment, but a two-layer, three-layer, or higher layer lamination structure film may also be used. Note that a chamber capable of plasma CVD is used here, but a chamber which is capable of sputtering by use of a target may also be used.

After completing the deposition of the insulating film, the processing substrate is pulled out into the common chamber by the robot arm, and is then transported to the second chamber 12. Film deposition is performed within the second chamber at a temperature of 150 to 300° C., similar to that of the first chamber, and the first amorphous semiconductor film 105 is obtained by plasma CVD. Note that a film such as a microcrystalline semiconductor film, an amorphous germanium film, an amorphous silicon germanium film, or a lamination film of these films can be used as the first amorphous semiconductor film. Further, a heat treatment process for reducing the concentration of hydrogen may be omitted with a formation temperature of 350 to 500° C. for the first amorphous semiconductor film. Note that a chamber capable of plasma CVD is used here, but a chamber which is capable of sputtering by use of a target may also be used.

After completing deposition of the first semiconductor film, the processing substrate is pulled out into the common chamber and then transported to the third chamber 13. Film deposition process is performed within the third chamber at a temperature of 150 to 300° C., similar to that of the second chamber, and the second amorphous semiconductor film 106, containing an impurity element which imparts n-type conductivity (P or As), is obtained by plasma CVD. Note that a chamber capable of plasma CVD is used here, but a chamber which is capable of sputtering by use of a target may also be used.

After completing deposition of the second amorphous semiconductor film containing an impurity element which imparts n-type conductivity, the processing substrate is pulled out into the common chamber, and then is transported to the fourth chamber 14. The first conductive film 107 is obtained within the fourth chamber by sputtering using a metallic target.

The processed substrate, on which four layers have thus been formed in succession, is then transported to the load-lock chamber 15 by the robot arm, and is contained in a cassette 29.

Note that the apparatus shown in FIG. 10 is only one example. Further, it is possible to freely combine this Embodiment with any one of Embodiments 1 to 4.

Embodiment 6

In Embodiment 5, an example of successive lamination using a plurality of chambers is shown, but in this Embodiment a method of successive lamination within one chamber maintained at high vacuum using the apparatus shown in FIG. 11 is employed.

The apparatus system shown in FIG. 11 is used in this Embodiment. In FIG. 11, reference numeral 40 denotes a processing substrate, reference numeral 50 denotes a common chamber, 44 and 46 denote load-lock chambers, 45 denotes a chamber, and reference numerals 42 and 43 denote cassettes. In order to prevent contamination developing during transport of the substrate, lamination is performed in the same chamber in this Embodiment.

It is possible to freely combine this Embodiment with any one of Embodiments 1 to 4.

Note that, when applied to Embodiment 1, a plurality of targets are prepared in the chamber 45, and the insulating film 104, the first amorphous semiconductor film 105, the second amorphous semiconductor film 106 containing an impurity element which imparts n-type conductivity, and the first conductive film 107 may be laminated by changing the reaction gas in order.

Further, when applied to Embodiment 4, the insulating film 104, the first amorphous semiconductor film 105, and the amorphous second semiconductor film 106, containing an impurity element which imparts n-type conductivity, may be laminated by changing the reaction gas in order.

Embodiment 7

In Embodiment 1, an example of forming the second amorphous semiconductor film containing an impurity element which imparts n-type conductivity by using sputtering is shown, but in this Embodiment an example of forming it by using plasma CVD is shown. Note that, except for the method of forming the second amorphous semiconductor film containing an impurity element which imparts n-type conductivity, this Embodiment is identical to Embodiment 1, and therefore only differing points are stated below.

If phosphine ($PH_3$) is added at a concentration of 0.1 to 5% with respect to silane ($SiH_4$) as a reaction gas using plasma CVD, then the second amorphous semiconductor film containing an impurity element which imparts n-type conductivity can be obtained.

Embodiment 8

In Embodiment 7, an example of forming the second amorphous semiconductor film containing an impurity element which imparts n-type conductivity by using plasma CVD is shown, and in this Embodiment, an example of using a microcrystalline semiconductor film containing an impurity element which imparts n-type conductivity is shown.

By setting the substrate temperature from 80 to 300° C., preferably between 140 and 200° C., taking a gas mixture of silane diluted by hydrogen ($SiH_4:H_2=1:10$ to 100) and phosphine ($PH_3$) as the reaction gas, setting the gas pressure from 0.1 to 10 Torr, and setting the discharge power from 10 to 300 $mW/cm^2$, a microcrystalline silicon film can be obtained. Further, the film may be formed by adding phosphorous after film deposition of this microcrystalline silicon film by using plasma doping.

Embodiment 9

FIG. 12 is a diagram which schematically shows a state of constructing an electro-optical display device by using the COG method. A pixel region 803, an external input-output terminal 804, and a connection wiring 805 are formed on a first substrate. Regions surrounded by dotted lines denote a region 801 for attaching a scanning line side IC chip, and a region 802 for attaching a data line side IC chip. An opposing electrode 809 is formed on a second substrate 808, and this is joined to the first substrate 800 by using a sealing material 810. A liquid crystal layer 811 is formed inside the sealing material 810 by injecting a liquid crystal. The first substrate and the second substrate are joined with a predetermined gap, and this is set from 3 to 8 µm for a nematic liquid crystal, and from 1 to 4 µm for a smectic liquid crystal.

IC chips 806 and 807 have circuit structures which differ between the data line side and the scanning line side. The IC chips are mounted on the first substrate. An FPC (flexible printed circuit) 812 is attached to the external input-output terminal 804 in order to input power supply and control signals from the outside. In order to increase the adhesion strength of the FPC 812, a reinforcing plate 813 may be formed. The electro-optical device can thus be completed. If an electrical inspection is performed before mounting the IC chips on the first substrate, then the final process yield of the electro-optical device can be improved, and the reliability can be increased.

Further, a method such as a method of connection using an anisotropic conductive material or a wire bonding method, can be employed as the method of mounting the IC chips on the first substrate. FIG. 13 shows examples of such. FIG. 13(A) shows an example in which an IC chip 908 is mounted on a first substrate 901 using an anisotropic conductive material. A pixel region 902, a lead wire 906, a connection wiring and an input-output terminal 907 are formed on the first substrate 901. A second substrate is bonded to the first substrate 901 by using a sealing material 904, and a liquid crystal layer 905 is formed therebetween.

Further, an FPC 912 is bonded to one edge of the connection wiring and the input-output terminal 907 by using an anisotropic conductive material. The anisotropic conductive material is made from a resin 915 and conductive particles 914 having a diameter of several tens to several hundred of µm and plated by a material such as Au, and the wiring 913 formed with the FPC 912, and the connection wiring and the input-output terminal 907 are electrically connected by the conductive particles 914. The IC chip 908 is also similarly bonded to the first substrate by an anisotropic conductive material. An input-output terminal 909 provided with the IC chip 908 and the lead wire 906 or a connection wiring and the input-output terminal 907 are electrically connected by conductive particles 910 mixed into a resin 911.

Furthermore, as shown by FIG. 13(B), the IC chip may be fixed to the first substrate by an adhesive material 916, and an input-output terminal of the IC chip and a lead wire or a connection wiring may be connected by an Au wire 917. Then, this is all sealed by a resin 918.

The method of mounting the IC chip is not limited to the method based on FIGS. 12 and 13, and it is also possible to use a known method not explained here, such as a COG method, a wire bonding method or a TAB method.

It is possible to freely combine this Embodiment with any one of Embodiments 1, and 3 to 8.

Embodiment 10

This Embodiment shows an example of using a plastic substrate (or a plastic film) as a substrate. Note that, except for the use of the plastic substrate as the substrate, this Embodiment is nearly identical to Embodiment 1, and therefore only differing points will be stated below.

PES (polyethylene sulfone), PC (polycarbonate), PET (polyethylene terephthalate) and PEN (polyethylene naphthalate) can be used as the plastic substrate material.

An active matrix substrate is completed using the plastic substrate provided that manufacturing is performed in accordance with Embodiment 1. Note that it is preferable to form the insulating film, the first amorphous semiconductor film, and the second amorphous semiconductor film containing an impurity element which imparts n-type conductivity by sputtering with the relatively low film deposition temperature.

A TFT having good characteristics can be formed on the plastic substrate, and the resulting display device can be made low weight. Further, it is possible to make a flexible electro-optical device because the substrate is plastic. Furthermore, assembly becomes easy.

Note that this Embodiment can be freely combined with any one of Embodiments 1 to 3, and 9.

Embodiment 11

An example is shown in Embodiment 1 in which wall-like spacers are formed on both the substrate 100 and the opposing substrate 124, but in this Embodiment, an example is shown using FIG. 15 in which the wall-like spacers are formed only in the opposing substrate. Note that, except for the formation of wall-like spacers 1501 on the opposing substrate 124, this Embodiment is the same as Embodiment 1, and therefore only differing points are explained.

A reverse stagger type n-channel TFT, and a storage capacitor can be completed in this Embodiment by three photolithography steps using three photomasks. A substrate prepared with a pixel portion in which the reverse stagger type n-channel TFTs are arranged in a matrix state corresponding to each of the pixels can be used as one substrate of an active matrix type liquid crystal display panel.

A top view of the wall-like spacers formed on the opposing substrate is shown in FIG. 18(b). The cross-sectional diagrams of FIG. 15 correspond to a face sectioned along the dotted line Y-Y'.

Furthermore, when applying the liquid crystal display device, in which the wall-like spacers are formed in the opposing substrate, to a normally white mode, a portion in which there is orientation disorder in the periphery of the wall-like spacers 1501, or a portion having non-uniform threshold voltage due to disordered orientation, is hidden from the recognition of the user of the display by the wall-like spacers themselves, and light leakage can be reduced. Therefore, a multi-domain perpendicular orientation type liquid crystal display device prepared with a high contrast, high-grade display can be obtained by suppressing light leakage through the wall-like spacers.

Note that it is possible to freely combine this Embodiment with any one of Embodiments 1 to 10.

Embodiment 12

In Embodiment 12, an example of forming an orientation film after forming a convex portion in an active matrix substrate is shown in FIG. 16. Note that, except for the formation of orientation films 1601 and 1602, and the formation of a convex portion 1603, Embodiment 12 is the same as Embodiment 1, and therefore only points of difference are explained.

An active matrix substrate is formed first in accordance with Embodiment 1.

The convex portion 1603, having a shape which differs from that of the wall-like spacers of Embodiment 1, is formed next. An organic resin material having at least one material chosen from the group consisting of acrylics, polyimides, polyimide amines, and epoxies as its main constituent; or an inorganic material chosen from the group consisting of silicon oxide, silicon nitride, and silicon nitride oxide, or a lamination film of such materials can be used as the material for the convex portion 1603.

Further, an example of forming the convex portion on a pixel electrode is shown by FIG. 16, but a structure in which wirings are arranged in desired locations and the convex portion is formed on an insulating film covering the wirings, and in which liquid crystals are oriented by using the convex portion may also be used.

Next, the orientation film 1601 (JALS-2021; made by JSR) for perpendicular orientation is formed on the convex portion 1603. Wall-like spacers similar to those of Embodiment 1 are formed on an opposing substrate. Further, the orientation film 1602 for perpendicular orientation is also formed on the opposing substrate 124 in which an opposing electrode is formed. Then, after joining together both substrates by using a sealant while maintaining the substrate gap by the wall-like spacers formed on the opposing substrate, an n-type liquid crystal material is injected between both substrates. After injecting the liquid crystal material, the injection port is sealed by a resin material.

Afterward, in accordance with Embodiment 1, a wiring for performing external electrical connections is connected, and a liquid crystal display panel is completed.

When there is no voltage applied, the orientation is controlled by the wall-like spacers and the orientation film 1601 on the active matrix substrate, and by the wall-like spacers and the orientation film 1602 on the opposing substrate, so that the n-type liquid crystal has a constant direction. Using the liquid crystal display panel of Embodiment 12, a multi-domain perpendicular orientation type liquid crystal display device having a wide viewing angle display and a little gap unevenness can be obtained.

Note that it is possible to freely combine Embodiment 12 with any one of Embodiments 1 to 10.

Embodiment 13

A top view is shown in FIG. 18(a) of the wall-like spacers shown in Embodiment 1. A wall-like spacer arrangement which differs from that of Embodiment 1 is shown in Embodiment 13.

The wall-like spacers shown in FIG. 18(b) are an example of wall-like spacers with a straight line shape and formed on only one substrate, as shown in Embodiment 11.

The wall-like spacers shown in FIG. 18(c) have a branched shape. A structure in which adjoining wall-like spacers are formed on one substrate, or a structure in which they are formed on both substrates may be used.

Further, the wall-like spacers shown in FIG. 18(d) are lattice-shaped. The wall-like spacers are formed on one substrate for the case of the wall-like spacers shown in FIG. 18(d). Furthermore, when the wall-like spacers shown in FIG. 18(d) are used, after dripping the liquid crystal, they are joined to another substrate.

Note that the present invention is not limited to the top arrangements shown in FIG. 18, and that any arrangement which can orient an n-type liquid crystal may be used. For example, a T-shape or a ladder-like arrangement may also be used.

Note that it is possible to freely combine Embodiment 13 with any one of Embodiments 1 to 12.

Embodiment 14

In Embodiment 14, an example of forming a protecting circuit in a region other than a pixel portion, utilizing the same material film as a pixel electrode is shown in FIG. 19.

In FIG. 19(A), reference numeral 701 denotes a wiring, and shows a gate wiring, a source wiring, or a capacitor wiring extended from the pixel portion. Further, an electrode 701 made from a second conductive film is formed so as to be embedded in a region in which the wiring 701 is not formed, and so as to not overlap with the wiring 701. Embodiment 14 shows an example of forming a protecting circuit without increasing the number of masks, but is not particularly limited to the structure shown in FIG. 19(A). For example, the protecting circuit may also be formed by a protecting diode or TFTs by increasing the number of masks.

Further, FIG. 19(B) shows an equivalent circuit diagram.

By using this type of structure, the generation of static electricity due to friction between manufacturing devices and an insulating substrate during manufacturing can be prevented. In particular, elements such as TFTs can be protected from static electricity generated during a liquid crystal orientation process of rubbing performed during manufacture.

Note that Embodiment 14 can be freely combined with any one of Embodiments 1 to 13.

Embodiment 15

A bottom gate type TFT formed by implementing any one of the above Embodiments 1 to 14 can be used in various electro-optical devices (such as an active matrix liquid crystal display device, an active matrix EL display device, and an active matrix EC display device). Namely, the present invention can be implemented in all electronic appliances in which these electro-optical devices are built into a display portion.

The following can be given as such electronic equipment: a video camera, a digital camera, a projector (rear type or front type), a head-mounted display (goggle type display), a car navigation system, a car stereo, a personal computer, and a portable information terminal (such as a mobile computer, a portable telephone or an electronic book). Examples of these are shown in FIGS. 20 and 21.

FIG. 20(A) is a personal computer, and it includes a main body 2001, an image input portion 2002, a display portion 2003, and a keyboard 2004. The present invention can be applied to the display portion 2003.

FIG. 20(B) is a video camera, and it includes a main body 2101, a display portion 2102, an audio input portion 2103, operation switches 2104, a battery 2105, and an image receiving portion 2106. The present invention can be applied to the display portion 2102.

FIG. 20(C) is a mobile computer, and it includes a main body 2201, a camera portion 2202, an image receiving portion 2203, operation switches 2204, and a display portion 2205. The present invention can be applied to the display portion 2205.

FIG. 20(D) is a player that uses a recording medium on which a program is recorded (hereafter referred to as a recording medium), and the player includes a main body 2401, a display portion 2402, a speaker portion 2403, a recording medium 2404, and operation switches 2405, etc. Note that this player uses a recording medium such as a DVD (digital versatile disk) or a CD, and the appreciation of music, the appreciation of film, game playing and the Internet can be performed. The present invention can be applied to the display portion 2402.

FIG. 20(E) is a digital camera, and it includes a main body 2501, a display portion 2502, an eyepiece portion 2503, operation switches 2504, and an image receiving portion (not shown in the figure), etc. The present invention can be applied to the display portion 2502.

FIG. 21(A) is a portable telephone, and it includes a main body 2901, an audio output portion 2902, an audio input portion 2903, a display portion 2904, operation switches 2905, and an antenna 2906, etc. The present invention can be applied to the display portion 2904.

FIG. 21(B) is a portable book (electronic book), and it includes a main body 3001, display portions 3002 and 3003, a recording medium 3004, operation switches 3005, and an antenna 3006. The present invention can be applied to the display portions 3002 and 3003.

FIG. 21(C) is a display, and it includes a main body 3101, a support stand 3102, and a display portion 3103, etc. The present invention can be applied to the display portion 3103. The display of the present invention is advantageous for a large size screen in particular, and is advantageous for a display equal to or greater than 10 inches (especially equal to or greater than 30 inches) in the opposite angle.

The applicable range of the present invention is thus extremely wide, and it is possible to apply the present invention to electronic equipment in all fields. Furthermore, the electronic equipment of Embodiment 15 can be realized using a constitution having any type of combination of Embodiments 1 to 14.

EFFECTS OF THE INVENTION

By forming a pixel TFT portion having a reverse stagger type n-channel TFT, and a storage capacitor, by three photolithography steps using three photomasks, and in addition, by having a uniform cell gap by forming wall-like spacers by one photolithography step, without performing a rubbing process, a multi-domain perpendicular orientation type liquid crystal display device having a wide viewing angle display, and in which a switching direction of the liquid crystal molecules is controlled, can be realized by the present invention.

The invention claimed is:

1. A liquid crystal display device having first and second substrates and a liquid crystal maintained between the first and second substrates, comprising:
a gate wiring over one of the first and second substrates;
an insulating film over said gate wiring;

an amorphous semiconductor film over said insulating film;
a source region and a drain region over said amorphous semiconductor film;
a source wiring over one of said source region and said drain region;
an electrode over the other of said source and drain regions;
a pixel electrode formed over said electrode; and
at least first and second gap retaining elements provided for maintaining a gap between the first and second substrates,
wherein each of the first and second gap retaining elements has a first end surface facing the first substrate and a second end surface facing the second substrate,
wherein the first end surface of the first gap retaining element is smaller than the second end surface of the first gap retaining element,
wherein the first end surface of the second gap retaining element is larger than the second end surface of the second gap retaining element, and
wherein said pixel electrode covers edges of said amorphous semiconductor film, and one of said source region and said drain region, and contacts with said insulating film.

2. The liquid crystal display device according to claim 1, wherein at least one of the substrates has an orientation film.

3. The liquid crystal display device according to claim 1, wherein at least one of said gap retaining elements has a constant taper angle.

4. The liquid crystal display device according to claim 3, wherein the taper angle of at least one of said gap retaining elements is from 75.0° to 89.9°, preferably from 82° to 87°.

5. The liquid crystal display device according to claim 1, wherein at least one of said gap retaining elements comprises:
an organic resin material comprising at least one material chosen from the group consisting of acrylics, polyimides, polyimide amines, and epoxies as its main constituent; or
an inorganic material chosen from the group consisting of silicon oxide, silicon nitride, and silicon nitride oxide or a lamination film of such materials.

6. The liquid crystal display device according to claim 1, wherein the major axis direction of the liquid crystal molecules in the vicinity of the at least one side face of said gap retaining elements has strongly regulated orientation so as to be roughly parallel with respect to the side face.

7. The liquid crystal display device according to claim 1, wherein the liquid crystal has negative dielectric anisotropy.

8. The liquid crystal display device according to claim 1, wherein one end surface of said drain region or said source region roughly coincides with an end surface of said amorphous semiconductor film and an edge surface of said electrode.

9. The liquid crystal display device according to claim 1, wherein one end surface of said drain region or said source region roughly coincides with an end surface of said amorphous semiconductor film and an end surface of said electrode, and
wherein another end surface of said drain region or said source region roughly coincides with an end surface of said pixel electrode and another end surface of said electrode.

10. The liquid crystal display device according to claim 1, wherein said source region and said drain region are made from an amorphous semiconductor film containing an impurity element which imparts n-type conductivity.

11. The liquid crystal display device according to claim 1, wherein said insulating film, said amorphous semiconductor film, said source region, and said drain region are formed in succession without exposure to the atmosphere.

12. The liquid crystal display device according to claim 1, wherein said insulating film, said amorphous semiconductor film, said source region, or said drain region is formed by sputtering.

13. The liquid crystal display device according to claim 1, wherein said insulating film, said amorphous semiconductor film, said source region, or said drain region is formed by plasma CVD.

14. The liquid crystal display device according to claim 1, wherein said gate wiring is formed from a film of an element selected from the group consisting of Al, Cu, Ti, Mo, W, Ta, Nd, and Cr, from an alloy film of said elements, or from a lamination film of said elements.

15. The liquid crystal display device according to claim 1, wherein said source region and said drain region are formed by the same mask as said amorphous semiconductor film and said electrode.

16. The liquid crystal display device according to claim 1, wherein said source region and said drain region are formed by the same mask as said source wiring.

17. The liquid crystal display device according to claim 1, wherein said source region and said drain region are formed by the same mask as said source wiring and said pixel electrode.

18. The liquid crystal display device according to claim 1, wherein said pixel electrode contacts said insulating film.

19. The liquid crystal display device according to claim 1, wherein in said amorphous semiconductor film, the film thickness in a region contacting said source region and said drain region is formed thicker than the film thickness in a region between the region contacting said source region and the region contacting said drain region.

20. The liquid crystal display device according to claim 1, wherein said liquid crystal display device is a personal computer, a video camera, a portable information terminal, a digital camera, a digital video disk player, or an electronic amusement device.

21. The liquid crystal display device according to claim 1, wherein a pre-tilt angle of the liquid crystal is controlled by at least one side face of said at least first and second gap retaining elements to orient the liquid crystal.

22. The liquid crystal display device according to claim 1, wherein the second gap retaining element is adjacent to the first gap retaining element.

23. A liquid crystal display device comprising:
a gate wiring comprising a conductive material over one of first and second substrates;
an insulating film over the gate wiring;
an amorphous semiconductor film over said insulating film;
a pair of impurity regions over the amorphous semiconductor film;
a source wiring over one of said pair of impurity regions;
an electrode over the other of said pair of impurity regions;
a pixel electrode over the electrode and extending over said insulating film;
at least first and second gap retaining elements provided for maintaining a gap between the first and second substrates;
wherein each of the first and second gap retaining elements has a first end surface facing the first substrate and a second end surface facing the second substrate, wherein the first end surface of the first gap retaining element is smaller than the second end surface of the first gap retaining element, and wherein the first end surface of the second gap retaining element is larger than the second end surface of the second gap retaining element, a capacitor portion comprising:

a layer comprising the conductive material over the substrate;

the insulating film over the conductive material; and the pixel electrode extending over said insulating film, wherein the layer comprising the conductive material is covered by the pixel electrode through the insulating film;

wherein said pixel electrode covers edges of said amorphous semiconductor film, and one of said pair of impurity regions, and contacts with said insulating film, and wherein said source wiring includes a first portion formed over one of said pair of impurity regions and a second portion extending in an orthogonal direction with respect to said layer comprising the conductive material.

24. The liquid crystal display device according to claim 23, wherein at least one of the substrates has an orientation film.

25. The liquid crystal display device according to claim 23, wherein at least one of said gap retaining elements has a constant taper angle.

26. The liquid crystal display device according to claim 25, wherein the taper angle of at least one of said gap retaining elements is from 75.0° to 89.9°, preferably from 82° to 87°.

27. The liquid crystal display device according to claim 23, wherein at least one of said gap retaining elements comprises: an organic resin material comprising at least one material selected from the group consisting of acrylics, polyimides, polyimide amines, and epoxies as its main constituent; or an inorganic material selected from the group consisting of silicon oxide, silicon nitride, and silicon nitride oxide or a lamination film of such materials.

28. The liquid crystal display device according to claim 23, wherein the major axis direction of the liquid crystal molecules in the vicinity of the at least one side face of said gap retaining elements has strongly regulated orientation so as to be roughly parallel with respect to the side face.

29. The liquid crystal display device according to claim 23, wherein the liquid crystal has negative dielectric anisotropy.

30. The liquid crystal display device according to claim 23, wherein said gate wiring is formed from a film of an element selected from the group consisting of Al, Cu, Ti, Mo, W, Ta, Nd, and Cr, from an alloy film of said elements, or from a lamination film of said elements.

31. The liquid crystal display device according to claim 23, wherein said liquid crystal display device is a personal computer, a video camera, a portable information terminal, a digital camera, a digital video disk player, or an electronic amusement device.

32. The liquid crystal display device according to claim 23, wherein a pre-tilt angle of the liquid crystal is controlled by at least one side face of said at least first and second gap retaining elements to orient the liquid crystal.

33. The liquid crystal display device according to claim 23, wherein the second gap retaining element is adjacent to the first gap retaining element.

34. A liquid crystal display device comprising:

a gate wiring comprising a first conductive material over one of first and second substrates;

an insulating film over the gate wiring;

an amorphous semiconductor film over said insulating film;

a pair of impurity regions over the amorphous semiconductor film;

a source wiring over one of said pair of impurity regions;

an electrode over the other of said, pair of impurity regions;

a pixel electrode comprising a second conductive material over the electrode, said second conductive material extending over said first conductive material;

at least first and second gap retaining elements over the pixel electrode, wherein the at least first and second gap retaining elements are provided for maintaining a gap between the first and second substrates;

wherein each of the first and second gap retaining elements has a first end surface facing the first substrate and a second end surface facing the second substrate, wherein the first end surface of the first gap retaining element is smaller than the second end surface of the first gap retaining element, and wherein the first end surface of the second gap retaining element is larger than the second end surface of the second gap retaining element, a terminal portion comprising:

a first layer comprising the first conductive material over the substrate; and a second layer extending over the first layer, the second layer comprising the second conductive material, wherein said pixel electrode covers edges of the amorphous semiconductor film, and one of said impurity regions, and contacts with said insulating film.

35. The liquid crystal display device according to claim 34, wherein at least one of the substrates has an orientation film.

36. The liquid crystal display device according to claim 34, wherein at least one of said gap retaining elements has a constant taper angle.

37. The liquid crystal display device according to claim 36, wherein the taper angle of at least one of said gap retaining elements is from 75.0° to 89.9°, preferably from 82° to 87°.

38. The liquid crystal display device according to claim 34, wherein at least one of said gap retaining elements comprises: an organic resin material comprising at least one material selected from the group consisting of acrylics, polyimides, polyimide amines, and epoxies as its main constituent; or an inorganic material selected from the group consisting of silicon oxide, silicon nitride, and silicon nitride oxide or a lamination film of such materials.

39. The liquid crystal display device according to claim 34, wherein the major axis direction of the liquid crystal molecules in the vicinity of the at least one side face of said gap retaining elements has strongly regulated orientation so as to be roughly parallel with respect to the side face.

40. The liquid crystal display device according to claim 34, wherein the liquid crystal has negative dielectric anisotropy.

41. The liquid crystal display device according to claim 34, wherein said gate wiring is formed from a film of an element selected from the group consisting of Al, Cu, Ti, Mo, W, Ta, Nd, and Cr, from an alloy film of said elements, or from a lamination film of said elements.

42. The liquid crystal display device according to claim 34, wherein said liquid crystal display device is a personal computer, a video camera, a portable information terminal, a digital camera, a digital video disk player, or an electronic amusement device.

43. The liquid crystal display device according to claim 34, wherein a pre-tilt angle of the liquid crystal is controlled by at least one side face of said at least first and second gap retaining elements to orient the liquid crystal.

44. The liquid crystal display device according to claim 34, wherein the second gap retaining element is adjacent to the first gap retaining element.

45. A liquid crystal display device comprising:
a gate wiring comprising a first conductive material over one of first and second substrates;
an insulating film over the gate wiring;
an amorphous semiconductor film over said insulating film;
a pair of impurity regions over the amorphous semiconductor film;
a source wiring over one of said pair of impurity regions;
an electrode over the other of said pair of impurity regions;
a pixel electrode comprising a second conductive material over the electrode, said second conductive material extending over said insulating film and over said first conductive layer;
at least first and second gap retaining elements provided for maintaining a gap between the first and second substrates;
wherein each of the first and second gap retaining elements has a first end surface facing the first substrate and a second end surface facing the second substrate,
wherein the first end surface of the first gap retaining element is smaller than the second end surface of the first gap retaining element, and
wherein the first end surface of the second gap retaining element is larger than the second end surface of the second gap retaining element,
a capacitor portion comprising:
a layer comprising the first conductive material over the substrate;
the insulating film over the first conductive material; and
said second conductive material extending over the insulating film,
wherein the layer comprising the first conductive material is covered by the second conductive material through the insulating film;
wherein said source wiring includes a first portion formed over one of said pair of impurity regions and a second portion extending in an orthogonal direction with respect to said layer comprising the first conductive material,
a terminal portion comprising:
a first layer comprising the first conductive material over the substrate; and
a second layer extending over the first layer, the second layer comprising the second conductive material,
wherein said pixel electrode covers edges of the amorphous semiconductor film, and one of said impurity regions, and contacts with said insulating film.

46. The liquid crystal display device according to claim 45, wherein at least one of the substrates has an orientation film.

47. The liquid crystal display device according to claim 45, wherein at least one of said gap retaining elements has a constant taper angle.

48. The liquid crystal display device according to claim 47, wherein the taper angle of at least one of said gap retaining elements is from 75.0° to 89.9°, preferably from 82° to 87°.

49. The liquid crystal display device according to claim 45, wherein at least one of said gap retaining elements comprises: an organic resin material comprising at least one material selected from the group consisting of acrylics, polyimides, polyimide amines, and epoxies as its main constituent; or an inorganic material selected from the group consisting of silicon oxide, silicon nitride, and silicon nitride oxide or a lamination film of such materials.

50. The liquid crystal display device according to claim 45, wherein the major axis direction of the liquid crystal molecules in the vicinity of the at least one side face of said gap retaining elements has strongly regulated orientation so as to be roughly parallel with respect to the side face.

51. The liquid crystal display device according to claim 45, wherein the liquid crystal has negative dielectric anisotropy.

52. The liquid crystal display device according to claim 45, wherein said gate wiring is formed from a film of an element selected from the group consisting of Al, Cu, Ti, Mo, W, Ta, Nd, and Cr, from an alloy film of said elements, or from a lamination film of said elements.

53. The liquid crystal display device according to claim 45, wherein said liquid crystal display device is a personal computer, a video camera, a portable information terminal, a digital camera, a digital video disk player, or an electronic amusement device.

54. The liquid crystal display device according to claim 45, wherein a pre-tilt angle of the liquid crystal is controlled by at least one side face of said at least first and second gap retaining elements to orient the liquid crystal.

55. The liquid crystal display device according to claim 45, wherein the second gap retaining element is adjacent to the first gap retaining element.

56. A liquid crystal display device comprising:
a gate wiring over one of first and second substrates;
an insulating film over the gate wiring;
an amorphous semiconductor film over said insulating film;
a pair of impurity regions over the amorphous semiconductor film;
a source wiring and an electrode over the pair of impurity regions;
a pixel electrode over the electrode; and
at least first and second gap retaining elements over the pixel electrode,
wherein each of the first and second gap retaining elements has a first end surface facing the first substrate and a second end surface facing the second substrate,
wherein the first end surface of the first gap retaining element is smaller than the second end surface of the first gap retaining element,
wherein the first end surface of the second gap retaining element is larger than the second end surface of the second gap retaining element, and
wherein said pixel electrode covers edges of the amorphous semiconductor film, and one of said pair of impurity regions, and contacts with said insulating film.

57. The liquid crystal display device according to claim 56, wherein at least one of the substrates has an orientation film.

58. The liquid crystal display device according to claim 56, wherein at least one of said gap retaining elements has a constant taper angle.

59. The liquid crystal display device according to claim 58, wherein the taper angle of at least one of said gap retaining elements is from 75.0° to 89.9°, preferably from 82° to 87°.

60. The liquid crystal display device according to claim 56, wherein at least one of said gap retaining elements comprises: an organic resin material comprising at least one material selected from the group consisting of acrylics, polyimides, polyimide amines, and epoxies as its main constituent; or an inorganic material selected from the group consisting of silicon oxide, silicon nitride, and silicon nitride oxide or a lamination film of such materials.

61. The liquid crystal display device according to claim 56, wherein the major axis direction of the liquid crystal molecules in the vicinity of the at least one side face of said gap retaining elements has strongly regulated orientation so as to be roughly parallel with respect to the side face.

62. The liquid crystal display device according to claim 56, wherein the liquid crystal has negative dielectric anisotropy.

63. The liquid crystal display device according to claim 56, wherein said gate wiring is formed from a film of an element selected from the group consisting of Al, Cu, Ti, Mo, W, Ta, Nd, and Cr, from an alloy film of said elements, or from a lamination film of said elements.

64. The liquid crystal display device according to claim 56, wherein said liquid crystal display device is a personal computer, a video camera, a portable information terminal, a digital camera, a digital video disk player, or an electronic amusement device.

65. The liquid crystal display device according to claim 56, wherein a pre-tilt angle of the liquid crystal is controlled by at least one side face of said at least first and second gap retaining elements to orient the liquid crystal.

66. The liquid crystal display device according to claim 56, wherein the second gap retaining element is adjacent to the first gap retaining element.

\* \* \* \* \*